(12) United States Patent
Hatsuda

(10) Patent No.: US 6,604,066 B1
(45) Date of Patent: *Aug. 5, 2003

(54) METHOD AND APPARATUS FOR CALCULATING DELAY FOR LOGIC CIRCUIT AND METHOD OF CALCULATING DELAY DATA FOR DELAY LIBRARY

(75) Inventor: Tsuguyasu Hatsuda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/523,724

(22) Filed: Mar. 13, 2000

Related U.S. Application Data

(63) Continuation of application No. 08/917,210, filed on Aug. 25, 1997, now Pat. No. 6,066,177.

(30) Foreign Application Priority Data

Aug. 27, 1996 (JP) .............................................. 8-225435
Jun. 27, 1997 (JP) .............................................. 9-171388

(51) Int. Cl.[7] .............................................. G06F 17/50
(52) U.S. Cl. .............................. 703/19; 703/14; 703/18; 716/6
(58) Field of Search ................................ 703/2, 13–22; 716/1–6; 327/261

(56) References Cited

U.S. PATENT DOCUMENTS 5,274,568 A 12/1993 Blinne et al. .................... 716/6
5,452,225 A 9/1995 Hammer ....................... 703/19
5,600,273 A 2/1997 Hall et al. .................... 327/261
5,703,798 A 12/1997 Dhar ........................... 703/14

FOREIGN PATENT DOCUMENTS

| JP | 5-159017 | 6/1993 |
| JP | 6-124318 | 5/1994 |
| JP | 7-110826 | 4/1995 |
| JP | 7-175838 | 7/1995 |
| JP | 7-239865 | 9/1995 |
| JP | 9-55433 | 2/1997 |
| JP | 11-073436 | 3/1999 |

Primary Examiner—Samuel Broda
(74) Attorney, Agent, or Firm—McDermott, Will & Emery

(57) ABSTRACT

In a delay-power-source-coefficient determining step, a drain saturation current in a P-channel MOSFET is calculated on the basis of specified operating power-source voltage data and of saturation-current parameters such as the mobility of carriers and the thickness of a gate oxide film based on said specified operating power-source voltage data. Thereafter, a ratio of a drain saturation current in the P-channel MOSFET when a reference power-source voltage is applied thereto to the drain saturation current in the P-channel MOSFET when an operating power-source voltage is applied thereto, thereby determining a delay power-source coefficient. Next, in an effective-delay calculating step, effective-delay calculating means multiplies a delay time when the reference power-source voltage calculated by the delay calculating means is applied thereto by the delay power-source coefficient calculated by delay-power-source-coefficient determining means to determine a delay time at the operating power-source voltage.

10 Claims, 26 Drawing Sheets

| a | b | ci | u | v | s |
|---|---|----|---|---|---|
| 0 | 0 | 0  | 1 | 1 | 0 |
| 0 | 0 | 1  | 1 | 0 | 1 |
| 0 | 1 | 0  | 1 | 0 | 1 |
| 0 | 1 | 1  | 0 | 1 | 0 |
| 1 | 0 | 0  | 1 | 1 | 1 |
| 1 | 0 | 1  | 1 | 0 | 0 |
| 1 | 1 | 0  | 1 | 0 | 0 |
| 1 | 1 | 1  | 0 | 1 | 1 |

| a | b | ci | w | x | co |
|---|---|----|---|---|----|
| 0 | 0 | 0  | 1 | 1 | 0  |
| 0 | 0 | 1  | 1 | 1 | 0  |
| 0 | 1 | 0  | 1 | 1 | 0  |
| 0 | 1 | 1  | 0 | 1 | 1  |
| 1 | 0 | 0  | 1 | 1 | 0  |
| 1 | 0 | 1  | 1 | 0 | 1  |
| 1 | 1 | 0  | 1 | 0 | 1  |
| 1 | 1 | 1  | 0 | 0 | 1  |

| RC | Ipeak | ΔT |
|---|---|---|
| 0.1ps | 1mA | 20ps |
| 0.5ps | 1.2mA | 50ps |
| 1.0ps | 1.3mA | 80ps |

METHOD AND APPARATUS FOR CALCULATING DELAY FOR LOGIC CIRCUIT AND METHOD OF CALCULATING DELAY DATA FOR DELAY LIBRARY

BACKGROUND OF THE INVENTION

This application is a continuation in part of copending application U.S. Ser. No. 08/917,210 filed on Aug. 25, 1997 now U.S. Pat. No. 6,066,177. The present invention relates to a method and apparatus for calculating a delay time for a logic circuit with high accuracy and to a method of calculating delay data for a delay library.

In an integrated circuit, different power-source voltages may be applied intentionally to an external power-source.terminal and to an internal circuit thereof with a view to improving the characteristics of the integrated circuit. However, as a higher-speed integrated circuit with a smaller feature size has been implemented, parasitic are produced therein so that different power-source voltages are applied unintentionally to the external power-source terminal and to the internal circuit.

The following are two conventional embodiments in which different power-source voltages are applied intentionally and unintentionally.

First Conventional Embodiment

To reduce the power consumption of an integrated circuit or increase the operating speed thereof, a power-source voltage applied to an internal circuit block may be used selectively. For example, a circuit block which should be reduced in power consumption is supplied with a voltage lower than a power-source voltage applied to a power-source terminal, while another circuit block which should operate at a higher speed is supplied with the power-source voltage equal to the external power-source voltage. In thus designing the integrated circuit, it is necessary to create a gate-level delay library for each of the power-source voltages and selectively use a desired delay library in order to verify a delay in signal propagation for the integrated circuit and the operation thereof.

Second Conventional Embodiment

When a consumed current flows through a power-source line (hereinafter referred to as a VDD line) for supplying a power-source potential to a circuit block in an integrated circuit and through a ground line (hereinafter referred to as a VSS line) for supplying a ground potential, a wiring parasitic composed of resistance (R), capacitance (C), and inductance (L) emerges at the VDD or VSS line and causes a voltage variation. For the sake of simplicity, it is assumed here that the parasitic on the power-source line is composed only of, e.g., resistance. Since the power-source voltage effectively applied to the circuit block is reduced by the voltage variation resulting from the wiring resistance, a delay time is increased accordingly. However, a conventional method of calculating a delay is disadvantageous in that the error between the result of analysis and the result of measurement is increased because of postulated ideal VDD and VSS lines which undergo no variation in power-source voltage applied thereto.

To prevent the error from being increased, e.g., Japanese Laid-Open Patent Publication HEI 6-124318 has disclosed a simulation method wherein the resistance of a power-source line is calculated by a data extracting unit, a process-parameter storing unit, and a power-source-voltage storing unit, while a drain current in a MOSFET as a gate element is calculated by a gain-coefficient calculating unit and a drain-current calculating unit. After a voltage drop on the power-source line is calculated by using the resistance on the power-source line and the drain current, a delay time is calculated by a propagation delay calculator from the gain coefficient $\beta$ of the drain current and an incidental capacitance.

Problems Associated with First Conventional Embodiment

As mentioned above, since the delay-data extracting process of obtaining desired delay data from the cell library is based on the setting of the power-source voltage at a specified value, it is necessary to repeatedly extract delay data a number of times equal to the number of different power-source voltages. With a multi-input gate such as a multi-bit adder cell, extraction time is elongated and hence the time required to design a cell library is elongated disadvantageously. In addition, a power-source voltage in consideration of an optimum delay time has been incompatible with a power-source voltage in consideration of optimum power consumption.

Problems Associated with Second Conventional Embodiment

Japanese Laid-Open Patent Publication HEI 6-124318 shown in the second conventional embodiment has not disclosed the relationship between the gain coefficient $\beta$ and the delay time in the propagation delay calculator, which is an important factor in calculating the dependency of the delay time on the power-source voltage and has not shown a specific method of calculating a delay time.

To analyze the delay time based on the dependency of the gain coefficient $\beta$ on the power-source voltage, there has been proposed a method of calculating the time required to charge or discharge a load capacitance or load resistance based on the voltage-dependency of a drain current in a MOSFET by a transistor-level or switch-level circuit simulation. However, the method is not practical since it uses a transistor-level netlist containing an increased number of circuit components as the target of the circuit simulation and therefore considerably long time is required by a large-scale circuit.

To calculate the dependency of the delay time on the power-source voltage, there has been proposed a method of multiplying the delay time by a coefficient indicative of the dependency of the delay time on the power-source voltage, which has been calculated previously. There has also been proposed a method of calculating a plurality of effective power-source voltages from which potentials corresponding to variations in power-source voltage on the VDD and VSS lines have preliminarily been reduced under each of the operating conditions and using the delay values extracted for the respective power-source voltages, as described in the first conventional embodiment. In the foregoing.methods, however, the effective power-source voltages should be predetermined and it is impossible to reliably analyze the influence of voltage variations on different power-source lines produced in each of the circuit blocks in an actual integrated circuit, including a plurality of circuit blocks connected to power-source lines at different voltages and circuit blocks operating at different frequencies.

With an integrated circuit having internal circuit blocks operating at different power-source voltages, as used in the first conventional embodiment, a delay for the whole integrated circuit cannot be calculated by the method in which the coefficient indicative of the dependency of the delay time on the power-source voltage is used as a multiplier factor without distinction.

SUMMARY OF THE INVENTION

It is therefore an object of the present invention to reliably calculate a delay time for a logic circuit by easily and analytically calculating the dependency of the delay time on a power-source voltage and thereby thoroughly overcome the foregoing conventional problems.

To attain the foregoing object, the present invention multiplies a delay time for a logic circuit to which a first power-source voltage is applied by a power-source voltage coefficient which is a ratio of a second power-source voltage to the first power-source voltage and by a ratio of a drain saturation current in a FET when the first power-source voltage is applied thereto to a drain saturation current in the FET when the second power-source voltage is applied thereto and thereby calculates a delay time for the logic circuit to which the second power-source voltage is applied.

A first method of calculating a delay in signal propagation time for a logic circuit composed of a plurality of logic elements each including a FET, the delay in signal propagation time for said logic circuit resulting from first and second power-source voltages being applied to the logic circuit, the method comprising the steps of: designating, as a power-source voltage coefficient, a ratio of the second power-source voltage to the first power-source voltage; designating, as a current coefficient, a ratio of a drain saturation current in the FET when the first power-source voltage is applied thereto to a drain saturation current in the FET when the second power-source voltage is applied thereto; calculating a first delay time, the first delay time being a delay time for the logic circuit when the first power-source voltage is applied thereto; calculating a product of the first delay time, the power-source voltage coefficient, and said current coefficient; and designating the result of the product as a second delay time which is a delay time for the logic circuit when the second power-source voltage is applied thereto.

In accordance with the first method of calculating a delay for a logic circuit, once the relationship between the power-source voltage and the drain saturation current in the FET is defined, the dependency of the delay time for the logic circuit on the power-source voltage can be calculated easily and analytically by using delay data extracted at the first power-source voltage from a cell library.

A second method of calculating a delay for a logic circuit according to the present invention is a method of calculating a delay in signal propagation time for a logic circuit composed of a plurality of circuit blocks resulting from different effective power-source voltages at which the circuit blocks operate, each of the circuit blocks being composed of a plurality of logic elements each including a FET, the method comprising the.steps of: calculating a power-source voltage coefficient which is a ratio of the power-source voltage for each of the circuit blocks to a reference power-source voltage; calculating a current coefficient which is a ratio of a drain saturation current in the FET when the reference power-source voltage is applied thereto to a drain saturation current in the,FET when the effective power-source voltage for each of the circuit blocks is applied thereto; and calculating a reference delay time, the reference delay time being a delay time for each of the circuit blocks when the reference power-source voltage is applied thereto; calculating a product of the reference delay time, the power-source voltage coefficient for each of the circuit blocks, and the current coefficient for each of the circuit blocks; and designating the result of the product as an effective delay time which is a delay time for each of the circuit blocks.

In accordance with the second method of calculating a delay for a logic circuit, once the relationship between the power-source voltage and the drain saturation current in the FET is defined for each circuit block, the dependency of the delay time on the power-source voltage for each of the plurality of circuit blocks of the logic circuit can be calculated easily and analytically by using the delay data extracted at the reference power-source voltage from the cell library.

A third method of calculating a delay for a logic circuit according to the present invention is a method of calculating, a delay in signal propagation time for a logic circuit composed of a plurality of logic elements each including a FET, the delay in signal propagation time for the logic circuit resulting from a variation in power-source voltage, the method comprising the steps of: calculating a voltage variation caused by a current consumed by the logic circuit and by a wiring parasitic on a power-source line and calculating a difference between a reference power-source voltage applied to a power-source terminal and the voltage variation to calculate an effective power-source voltage applied to the logic circuit; calculating a power-source voltage coefficient which is a ratio of the effective power-source voltage to the reference power-source voltage, while calculating a current coefficient which is a ratio of a drain saturation current in the FET when the reference power-source voltage is applied thereto to a drain saturation current in the FET when the effective power-source voltage is applied thereto; and calculating a reference delay time, the reference delay time being a delay time for the logic circuit when the reference power-source voltage is applied thereto using the reference delay time data; calculating a product of the reference delay time, the power-source voltage coefficient for the logic circuit, and the current coefficient for the logic circuit; and determining the result of the product as an effective delay time which is a delay time for the logic circuit when the effective power-source voltage is applied thereto.

In accordance with the third method of calculating a delay for a logic circuit, once the relationship between the effective power-source voltage in which the voltage variation is reflected and the drain saturation current in the FET is defined, the dependency of the delay time for the logic circuit on the power-source voltage when the effective power-source voltage is applied can be calculated easily and analytically by using the delay data extracted at the reference power-source voltage from the cell library.

In the third method of calculating a delay for a logic circuit, the current consumed by the logic circuit is preferably a sum of currents consumed by specified ones of the plurality of logic elements operating simultaneously at a given operating time and a voltage variation on a power-source line connected to the specified logic elements is preferably calculated based on the sum of the consumed currents to provide the voltage variation. This enables easy and analytical calculation of the delay time in consideration of a dynamic voltage variation on the power-source line resulting from the time-varying consumed current.

In the first to third methods of calculating a delay for a logic circuit, the FET is preferably a P-channel MOSFET. With the arrangement, since the dependency of the drain saturation current on the power-source voltage is higher in the P-channel MOSFET than in an N-channel MOSFET, the dependency of the delay time on the power-source voltage is substantially proportional to the ratio of the power-source voltage to the drain saturation current, so that the dependency of the delay time on the power-source voltage when the power-source voltage is applied is reliably calculated.

In the first to third methods of calculating a delay for a logic circuit, the drain saturation current in the FET is preferably calculated by raising a difference between the power-source voltage and a threshold voltage of the FET to the power of a specified coefficient and multiplying the resulting value by a current gain coefficient. This enables reliable calculation of the drain saturation current in the FET.

A first apparatus for calculating a delay for a logic circuit is an apparatus for calculating, in simulating a logic circuit composed of a plurality of logic elements each including a FET, a delay in signal propagation time for the logic circuit resulting from a power-source voltage supplied thereto, the apparatus comprising: layout-data supplying means for supplying layout data used to determine the placement of the logic elements in the logic circuit; netlist supplying means for supplying netlist for the logic circuit: process parameter supplying means for supplying process information used to determine the routing of the logic circuit and electric characteristics of the logic elements; library-data supplying means for supplying delay data for the logic elements; delay-power source-coefficient determining means for determining a power-source voltage coefficient which is a ratio of a second power-source voltage to a first power-source voltage, while determining a current coefficient which is a ratio of a drain saturation current in the FET when the first power-source voltage is applied thereto to a drain saturation current in the FET when the second power-source voltage is applied thereto; delay calculating means for calculating a delay time for the logic circuit when the first power-source voltage is applied thereto based on the delay data, the layout data, the process information, and the netlist; and effective-delay calculating means for calculating a product of the delay time calculated by the delay calculating means, the power-source voltage coefficient, and the current coefficient and designating the result of calculation as an effective delay time for the logic circuit when the second power-source voltage is applied thereto.

In the first apparatus for calculating a delay for a logic circuit, once the relationship between the power-source voltage and the drain saturation current is defined, the dependency of the delay time for the logic circuit on the power-source voltage can be calculated easily and analytically by using the delay data extracted at the first power-source voltage from the cell library.

In the first apparatus for calculating a delay for a logic circuit, the logic circuit is preferably composed of a plurality of circuit blocks operating at different power-source voltages, the apparatus further comprising power-source-voltage-information supplying means for supplying power-source-voltage information for each of the logic circuit and the circuit blocks, the delay-power-source-coefficient determining means having means for determining block power-source voltage coefficients which define respective ratios of the power-source voltages for the individual circuit blocks to the reference power-source voltage and means for determining block current coefficients which define respective ratios of the drain saturation currents in the FETs when the reference power-source voltage is applied thereto to the drain saturation currents in the FETs when the power-source voltages for the individual circuit blocks are applied thereto.

With the arrangement, once the relationship between the power-source voltage and the drain saturation current in the FET is defined for each circuit block, the dependency of the delay time for each of the plurality of circuit blocks of the logic circuit on the power-source voltage can be obtained easily and analytically by using the delay data extracted at the reference power-source voltage from the cell library.

A second apparatus for calculating a delay for a logic circuit according to the present invention is an apparatus for calculating, in simulating a logic circuit composed of a plurality of logic elements each including a FET, a delay in signal propagation time for the logic circuit resulting from a variation in power-source voltage supplied thereto, the apparatus comprising: layout-data supplying means for supplying layout data used to determine the placement of the logic elements in the logic circuit; netlist supplying means for supplying netlist for the logic circuit; process-parameter supplying means for supplying process information used to determine the routing of the logic circuit and electric characteristics of the logic elements; library-data supplying means for supplying delay data and consumed current data each for the logic elements; signal-wiring extracting means for extracting a wiring parasitic on a signal line by using the layout data and the process parameters; power-source-line-parasitic extracting means for extracting a wiring parasitic on a power-source line connected to a power-source terminal and to the logic circuit by using the layout data and the process parameters; consumed-current calculating means for calculating a current consumed by the logic circuit by using the wiring parasitic on the signal line and the consumed current data; effective-power-source-voltage calculating means for calculating a voltage variation on the power-source line by using the consumed current and the wiring parasitic on the power-source line and calculating a difference between a power-source voltage applied to the power-source terminal and the voltage variation to calculate an effective power-source voltage; delay-power-source-coefficient determining means for determining a power-source voltage coefficient which is a ratio of the effective power-source voltage to the power-source voltage, while determining a current coefficient which is a ratio of a drain saturation current in the FET when the power-source voltage is applied thereto to a drain saturation current in the FET when the-effective power-source voltage is applied thereto; delay calculating means for calculating a delay time when the power-source voltage is applied thereto by using the wiring parasitic on the signal line and the delay data for the logic elements; and effective-delay calculating means for calculating a product of the delay time calculated by the delay calculating means, the power-source voltage coefficient, and the current coefficient and designating the result of calculation as an effective delay time for the logic circuit.

In the second apparatus for calculating a delay for a logic circuit, once the relationship between the effective power-source voltage in which the voltage variation is reflected and the drain saturation current in the FET is defined, the dependency of the delay time for the logic circuit on the power-source voltage when the effective power-source voltage is applied thereto can be calculated easily and analytically by using the delay data extracted at the reference power-source voltage from the cell library.

In the second apparatus for calculating a delay for a logic circuit, the consumed-current calculating means preferably calculates a sum of respective currents consumed by specified ones of the plurality of logic elements operating simultaneously at a given operating time, the effective-powersource-voltage calculating means preferably calculates a voltage variation on a power-source line connected to the specified logic elements by using the sum of the consumed currents and the wiring parasitic on the power-source line, and the delay-power-source-coefficient determining means preferably calculates the power-source voltage coefficient and the current coefficient for each of the plurality of logic elements by using the effective power-source voltage applied to the logic element in order of temporal precedence of the operating times of the logic elements. This enables easy and analytical calculation of the delay time in consideration of a dynamic voltage variation on the power-source line resulting from the time-varying consumed current.

In the second apparatus for calculating a delay for a logic circuit, the logic circuit is preferably an integrated circuit composed of at least one circuit block having at least one standard cell, the integrated circuit is preferably provided with an external power-source terminal to which the power-source voltage is applied thereto, at least one circuit block is preferably provided with a block power-source terminal connected to the external power-source terminal to receive a voltage for driving the circuit block applied thereto, at least one standard cell is preferably provided with a cell power-source terminal connected to the block power-source terminal to receive a voltage for driving the standard cell applied thereto, the consumed current calculating means preferably has: block; level consumed current calculating means for calculating a current consumed by the circuit block by using the wiring parasitic on the signal line and the consumed current data for the standard cell; and chip-level-consumed-current calculating means for calculating a current consumed by the integrated circuit by using the current consumed by the circuit block, and the effective-power-source-voltage calculating means preferably has: chip-level-voltage-variation calculating means for calculating a chip-level voltage variation which is a voltage variation on the power-source line between the external power-source terminal and the block power-source terminal by using the current consumed by the circuit block; chip-level-effective-power-source-voltage calculating means for calculating a chip-level effective power-source voltage by calculating a difference between the power-source voltage applied to the external power-source terminal and the chip-level voltage variation; block-level-voltage-variation calculating means for calculating a block-level-voltage variation which is a voltage variation between the block power-source terminal and the cell power-source terminal based on the consumed current.data for the standard cell; and block-level-effective-power-source-voltage calculating means for calculating a block-level effective power-source voltage by calculating a difference between the chip-level-effective-power-source voltage and the block-level voltage variation, the apparatus calculating an effective delay time for the integrated circuit-based on the block-level effective power-source voltage. With the arrangement, the consumed currents and the effective power-source voltages are calculated hierarchically and sequentially on the chip level, on the block level, and on the cell level, so that the delay time is reliably calculated even in a large-scale integrated circuit.

In the second apparatus for calculating a delay for a logic circuit, the consumed-current calculating means preferably calculates a sum of respective currents consumed by specified ones of a plurality of standard cells operating simultaneously at a given operating time, designates the sum as a current consumed by the standard cells, and calculates a voltage variation on a power-source line connected to the specified standard cells by using the current consumed by the standard cells and the wiring parasitic on the power-source line and the delay-power-source-coefficient determining means preferably calculates the power-source voltage coefficient and the current coefficient for each of the plurality of standard cells by using the effective power-source voltage applied to the standard cell in order of temporal precedence of the operating times of the standard cells. This enables easy and analytical calculation of the delay time in consideration of a dynamic voltage variation on the power-source line resulting from the time-varying consumed current.

In the second apparatus for calculating a delay for a logic circuit, the consumed-current, calculating means preferably has switching-frequency-data supplying means for supplying a switching frequency at each node in the netlist and calculates the current consumed by the integrated circuit by using the switching frequency, the wiring parasitic, and the consumed current data for the standard cell. With the arrangement, the switching frequency is not dependent on the wiring parasitic or on the current data in the cell library, so that it is possible to calculate the switching frequency without information on the load capacitance and resistance capacitance of actual wiring. As a result, it is not necessary to resupply a test pattern and simulate again the consumed current even in the case where the manufacturing process is changed, where the operating conditions such as the operating frequency and power-source voltage are changed, or where the configuration of the layout is changed as in a soft macro library, resulting in a reduced number of process steps for developing an integrated circuit.

In the second apparatus for calculating a delay for a logic circuit, the consumed-current calculating means preferably calculates a transition probability which is the probability of one logic value making a transition to the other logic value by using a logic function contained in the netlist and calculates the current consumed by the integrated circuit by using the transition probability, the wiring parasitic, and the consumed current data for the standard cell. With the arrangement, it is not necessary to resupply a test pattern and simulate again the consumed current even in the case where the manufacturing process is changed, where the operating conditions such as the operating frequency and power-source voltage are changed, or where the configuration of the layout is changed as in a soft macro library, resulting in a reduced number process steps for developing an integrated circuit.

Preferably, the first or second apparatus for calculating a delay for a logic circuit further comprises convergence condition judging means for storing the result of calculation outputted from the effective-power-source-voltage calculating means, judging whether or not a difference between the result of calculation obtained immediately before from the effective power-source-voltage calculating means and the stored result of calculation falls within a specified range, and, if the difference does not fall in the specified range, causing the consumed current calculating means and the effective-power-source-voltage calculating means to repeat the same procedures till the difference falls within the specified range. With the arrangement, the current consumed by the circuit and the effective power-source voltage supplied thereto, which are greatly dependent on each other, are calculated by forming a recursive loop, so that the delay time is calculated with higher accuracy.

In the first or second apparatus for calculating a delay for a logic circuit, a drain saturation current in the FET is preferably calculated by raising a difference between a power-source voltage and a threshold voltage of the FET to the power of a specified coefficient-and multiplying the resulting value by a current gain coefficient. This enables reliable calculation of the drain saturation current in the FET.

A first method of calculating delay data for a delay library according to the present invention is a method of calculating delay data representing a delay in signal propagation time for a delay library to be used in simulating a logic circuit composed of logic elements each including a FET, comprising the steps of: defining a power-source voltage coefficient, the power-source voltage coefficient being a ratio of a second power-source voltage to a first power-source voltage; defining a current coefficient, the current coefficient being a ratio of a drain saturation current in the FET when the first power-source voltage is applied thereto to a drain saturation current in the FET when the second power-source voltage is applied thereto; defining a first delay time, the first delay time being a delay time for the logic circuit when the first power-source voltage is applied thereto; and calculating a product of the first delay time, the power-source voltage coefficient, and the current coefficient to determine a second delay time, the second delay time being a delay time for the logic circuit when the second power-source voltage is applied thereto and designating the second delay time as delay data.

In accordance, with the first method of calculating delay data for a delay library according to the present invention, once the relationship between the power-source voltage and the drain saturation current in the FET is defined, the dependency of the delay time for the logic circuit on the power-source voltage can be calculated easily and analytically by using the delay data extracted at the first power-source voltage from the cell library. This reduces time required to extract the delay data and thereby permits short-term development of the cell library.

A second method of calculating delay data for a delay library according to the present invention is a method of calculating delay data representing a delay in signal propagation time for a delay library to be used in simulating a logic circuit composed of logic circuits including a P-channel MOSFET and an N-channel MOSFET, the method comprising the steps of: defining a power-source voltage coefficient, the power-source voltage being a ratio of a second power-source voltage to a first power-source voltage; defining a first current coefficient, the first current coefficient being a ratio of a drain saturation current in the P-channel MOSFET when the first power-source voltage is applied thereto to a drain saturation current in the P-channel MOSFET when the second power-source voltage is applied thereto; defining a second current coefficient, the second current coefficient being a ratio of a drain saturation current in the N-channel MOSFET when the first power-source voltage is applied thereto to a drain saturation current in the N-channel MOSFET when the second power-source voltage is applied thereto; defining a first rise delay time and a first fall delay time each for the logic circuit when the first power-source voltage is applied thereto; calculating a product of the first rise delay time, the power-source voltage coefficient, and the first current coefficient to determine a second rise delay time, the second rise delay time being a rise delay time for the logic circuit when the second power-source voltage is applied thereto and designating the second rise delay time as rise delay data; and calculating a product of the first fall delay time, the power-source voltage coefficient, and the second current coefficient to determine a second fall delay time, the second fall delay time being a fall delay time for the logic circuit when the second power-source voltage is applied thereto and designating the second fall delay time as fall delay data.

The second method of calculating delay data for a delay library achieves the same effect as achieved by the first method of calculating delay data for a delay library. In addition to that, the second method determines, as a rise delay produced in driving the P-channel MOSFET, the second rise delay time which is the rise delay time for the logic circuit when the second power-source voltage is applied thereto, while determining, as a fall delay produced in driving the N-channel MOSFET, the second fall delay time which is the fall delay time for the logic circuit when the second power-source voltage is applied. As a consequence, the rise delay data and the fall delay data can be calculated individually to compose the delay data. The resulting delay library is more specific and higher in accuracy.

To further attain the foregoing objects, the present invention may further comprise a storage element storing a computer readable program for calculating a delay in signal propagation time for a logic circuit composed of a plurality of logic elements each including a FET, the delay in signal propagation time for the logic circuit resulting from first and second power-source voltages being applied to the logic circuit, the program directing a computer to execute the steps of: designating, as a power-source voltage coefficient, a ratio of the second power-source voltage to the first power-source voltage; designating, as a current coefficient, a ratio of a drain saturation current in the FET when the first power-source voltage is applied thereto to a drain saturation current in the FET when the second power-source voltage is applied thereto; calculating a first delay time, the first delay time being a delay time for the logic circuit when the first power-source voltage is applied thereto; calculating a product of the first delay time, the power-source voltage coefficient, and the current coefficient; and designating the result of the product as a second delay time which is a delay time for the logic circuit when the second power-source voltage is applied thereto.

In accordance with the storage element, once the relationship between the power-source voltage and the drain saturation current in the FET is defined, the dependency of the delay time for the logic circuit on the power-source voltage can be calculated easily and analytically by using delay data extracted at the first power-source voltage from a cell library.

To further attain the foregoing objects, the present invention may further comprise an alternative storage element storing a computer readable program for calculating a delay in signal propagation time for a logic circuit composed of a plurality of circuit blocks resulting from different effective power-source voltages at which the circuit blocks operate, each of the circuit blocks being composed of a plurality of logic elements each including a FET, the program directing a computer to execute the steps of: calculating a power-source voltage coefficient which is a ratio of the power-source voltage for each of the circuit blocks to a reference power-source voltage; calculating a current coefficient which is a ratio of a drain saturation current in the FET when the reference power-source voltage is applied thereto to a drain saturation current in the FET when the effective power-source voltage for each of the circuit blocks is applied thereto; and calculating a reference delay time, the reference delay time being a delay time for each of the circuit blocks when the reference power-source voltage is applied thereto; calculating a product of the reference delay time, the power-source voltage coefficient for each of the circuit blocks, and the current coefficient for each of the circuit blocks; and designating the result of the product as an effective delay time which is a delay time for each of the circuit blocks.

In accordance with the alternative storage element, once the relationship between the power-source voltage and the drain saturation current in the FET is defined for each circuit block, the dependency of the delay time on the power-source voltage for each of the plurality of circuit blocks of the logic circuit can be calculated easily and analytically by using the delay data extracted at the reference power-source voltage from the cell library.

To further attain the foregoing objects, the present invention may further comprise another alternative storage element storing a computer readable program for calculating a delay in signal propagation time for a logic circuit composed of a plurality of logic elements each including a FET, the delay in signal propagation time for the logic circuit resulting from a variation in power-source voltage, the program directing a computer to execute the steps of: calculating a voltage variation caused by a current consumed by the logic circuit and by a wiring parasitic on a power-source line and calculating a difference between a reference power-source voltage applied to a power-source terminal and the voltage variation to calculate an effective power-source voltage applied to the logic circuit; calculating a power-source voltage coefficient which is a ratio of the effective power-source voltage to the reference power-source voltage, while calculating a current coefficient which is a ratio of a drain saturation current in the FET when the reference power-source voltage is applied thereto to a drain saturation current in the FET when the effective power-source voltage is applied thereto; and calculating a reference delay time, the reference delay time being a delay time for the logic circuit when the reference power-source voltage is applied thereto using the reference delay time data; calculating a product of the reference delay time, the power-source voltage coefficient for the logic circuit, and the current coefficient for the logic circuit; and determining the result of the product as an effective delay time which is a delay time for the logic circuit when the effective power-source voltage is applied thereto.

In accordance with the another alternative storage element, once the relationship between the effective power-source voltage in which the voltage variation is reflected and the drain saturation current in the FET is defined, the dependency of the delay time for the logic circuit on the power-source voltage when the effective power-source voltage is applied can be calculated easily and analytically by using the delay data extracted at the reference power-source voltage from the cell library.

In the above storage elements, the FET is preferably a P-channel MOSFET. With the arrangement, since the dependency of the drain saturation current on the power-source voltage is higher in the P-channel MOSFET than in an N-channel MOSFET, the dependency of the delay time on the power-source voltage is substantially proportional to the ratio of the power-source voltage to the drain saturation current, so that the dependency of the delay time on the power-source voltage when the power-source voltage is applied is reliably calculated.

In the above storage elements, the drain saturation current in the FET is preferably calculated by raising a difference between the power-source voltage and a threshold voltage of the FET to the power of a specified coefficient and multiplying the resulting value by a current gain coefficient. This enables reliable calculation of the drain saturation current in the FET.

DETAILED DESCRIPTION OF THE INVENTION

A description will be given first to a method of calculating the dependency of a delay time for a logic circuit on a power-source voltage supplied thereto.

Figure 1:
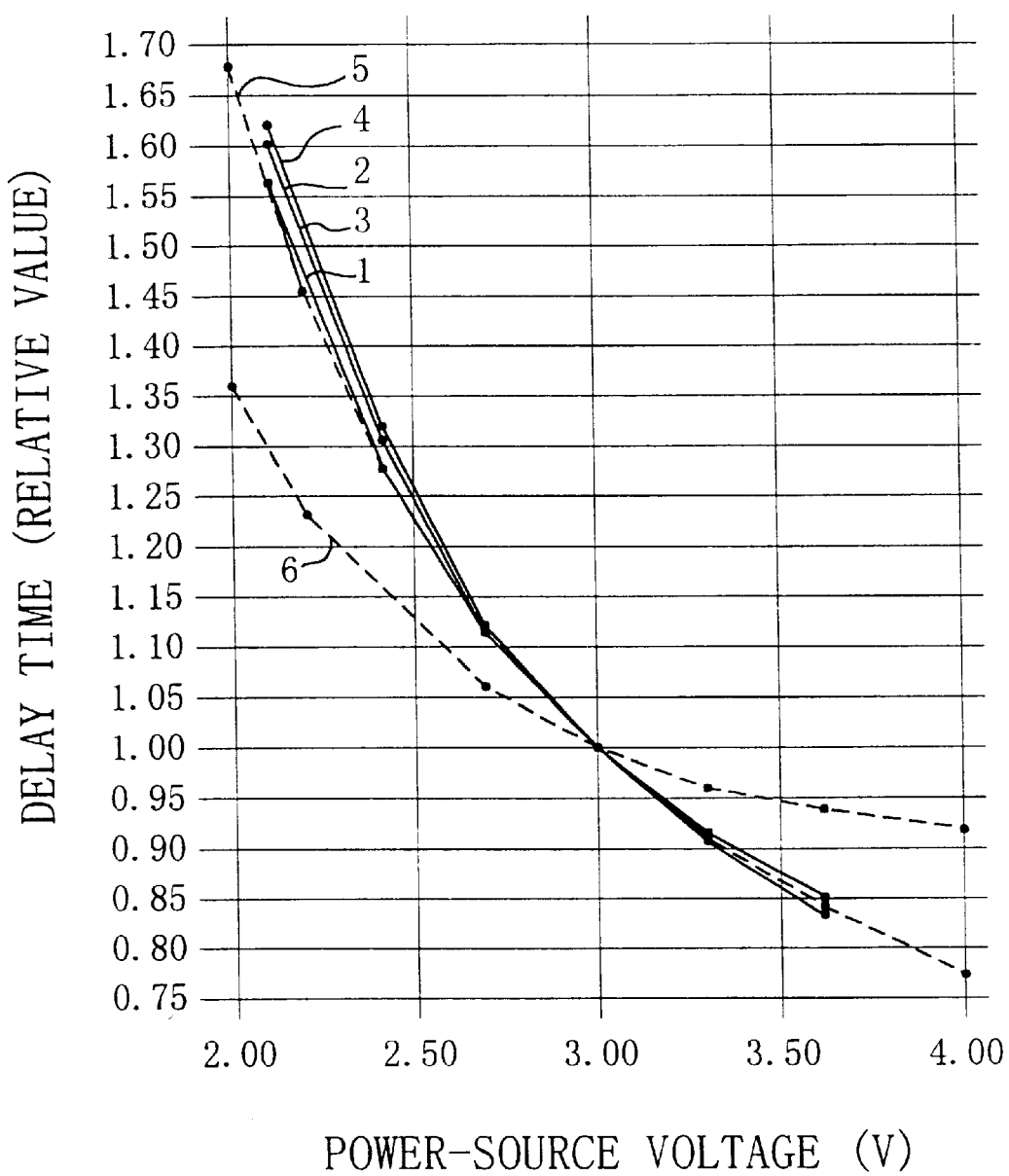
FIG. 1 is a graph showing the dependency of a delay time for a fundamental CMOS gate according to the present invention on a power-source voltage supplied thereto.

FIG. 1 is a graph showing the dependency of a fundamental CMOS gate composing each of a 2-input NAND gate, a 2-input NOR gate, a 4-input NAND gate, and a 4-input NOR gate on a power-source voltage supplied thereto. In the drawing, reference numerals 1, 2, 3, and 4 designate the 2-input NAND gate, the 2-input NOR gate, the 4-input NAND gate, and the 4-input NOR gate, respectively. Reference numerals 5 and 6 designate a ratio (Vdd/Idsp) of the power-source voltage Vdd to a drain saturation current Idsp in a P-channel MOSFET and a ratio (Vdd/Idsn) of the power-source voltage Vdd to a drain saturation current Idsn in an N-channel MOSFET, respectively.

Figure 2:
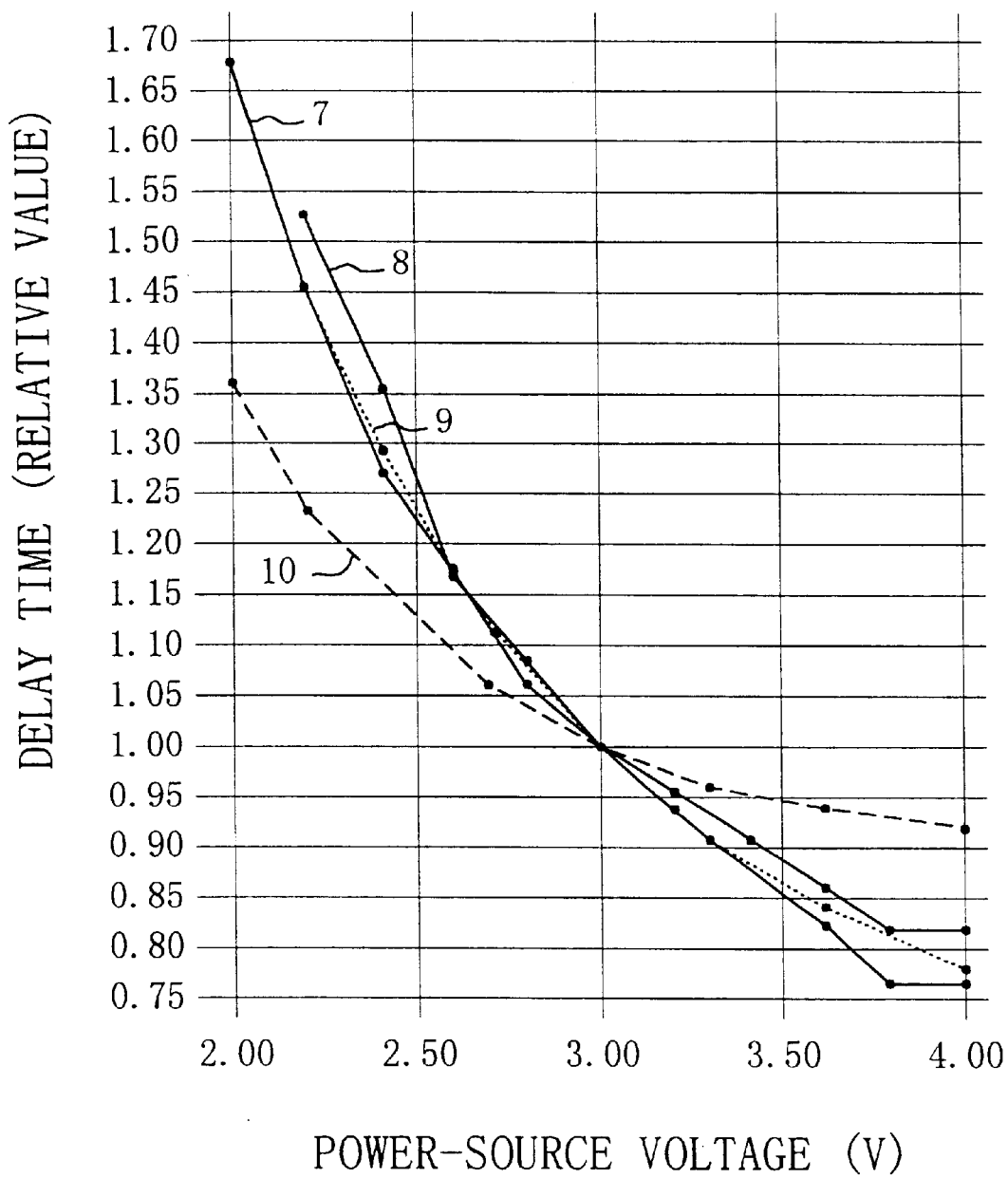
FIG. 2 is a graph showing the dependency of a delay time for a 4 KB static RAM circuit and equivalent to 3000 gates according to the present invention on a power-source voltage supplied thereto.

FIG. 2 is a graph showing the dependency of respective delay times for a circuit block equivalent to about 3000 gates laid out by a building block system using standard cells and for a 4KB static RAM circuit on the power-source voltage. In the drawing, reference numerals 7 and 8 designate the logic block and the static RAM, respectively. Reference numerals 9 and 10 designate a ratio (Vdd/Idsp) of the power-source voltage Vdd to a drain saturation current Idsp in a P-channel MOSFET in each circuit and a ratio (Vdd/Idsn) of the power-source voltage Vdd to a drain saturation current Idsn in an N-channel MOSFET in each circuit, respectively.

The drain saturation current is defined here as a current allowed to flow when a gate-to-source voltage and a drain-to-source voltage are set at the value of the power-source voltage Vdd.

A description will be given next to a method of analytically calculating a delay in signal propagation time for a logic circuit.

Since the delay time for the logic circuit generally corresponds to time required to release a charge Q accumulated in a load capacitance in the form of a drain current in a MOSFET, the relationship represented by the following numerical expression (1) is established:

$$Q = Id \cdot dt = ID \cdot Td = C1 \cdot \Delta V \quad (1)$$

The numerical expression (1) is transformed to provide the following numerical expression (2):

$$Td = Cl \cdot \frac{\Delta V}{Id} \quad (2)$$

where Cl is the load capacitance, Id is the drain current, $\Delta V$ is the potential variation caused by the charging or discharging of the load capacitance, and Td is the delay time.

Since Id and $\Delta V$ vary responsive to the power-source voltage Vdd, the relationship represented by the following relational expression (3) is further established:

$$TD \propto \frac{Vdd}{Ids} \quad (3)$$

where Ids is the drain saturation current at the power-source voltage Vdd.

The dependency of the drain saturation current Ids on the power-source voltage results from: a reduced mobility of carriers due to an electric field Vgs/Tox between a gate and a source (Vgs is a gate-to-source voltage and Tox is the thickness of an oxide film of gate) generated mainly by dispersive scattering, phonon scattering, and scattering caused by surface undulations, which are observed on the surface of a channel; from a saturation velocity due to an electric field Vds/Leff between a drain and the source (Vds is a drain-to-source voltage and Leff is an effective channel length); and from a reduced threshold voltage due to a short-channel effect caused by a drain electric field. The expression of the drain current Id representing the foregoing factors comprehensively is shown in IEEE Journal of Solid-State Circuits, vol. 25, No.2, April 1990 pp.584–594. The following numerical expression (4) represents the drain saturation current Ids expressed by using the mode of the expression shown in the document:

$$Ids = \beta/2 \cdot (Vgs - Vt)^\alpha \quad (4)$$

where $\beta$ is the gain coefficient of the MOSFET represented by $\beta = \mu \cdot Cox \cdot W/L$, and the remaining parameters are defined by $\mu$=mobility of carriers Cox=capacitance per unit area of gate oxide film W=gate width L=gate length Vt=threshold voltage of MOSFET.

As well known with a long-channel MOSFET, the value of an exponent $\alpha$ is 2.

In the case of setting each of the gate-to-source voltage Vss, the drain-to-source voltage Vds, and the power-source voltage Vdd to 3.3 V in a CMOS device having an extremely short gate length fabricated by a 0.5-$\mu$m CMOS process, the exponent a for the N-channel MOSFET has a value of 1.1 to 1.2, while the exponent a for the P-channel MOSFET has a value of 1.5 to 1.6. As the power-source voltage Vdd is lowered, the value of the exponent a approaches 2 for a long-channel MOSFET model.

When the P-channel MOSFET is compared with the N-channel MOSFET for the dependency of the drain saturation current Ids on the power-source voltage, it will be understood from the values of the foregoing exponent ax that the rate at which the drain saturation current decreases with the decrease of the power-source voltage is larger in the P-channel MOSFET than in the N-channel MOSFET. This proves that, as shown in FIGS 1 and 2, the dependency of the delay time on the power-source voltage is substantially proportional to a ratio (vdd/Idsp) of the power-source voltage Vdd to the drain saturation current Idsp.

If the delay time Td is expressed as a function of the drain saturation current Ids, the threshold voltage Vt of the MOSFET, and the exponent cc by using the relational expression (3) and the numerical expression (4), the dependency of the delay time on the power-source voltage can be represented by the following numerical expression (5) in a simple form:

$$Td = Td0 \frac{Vddi}{Vdd0} \cdot \frac{Idsp0}{Idspi} \quad (5)$$

$$= Td0 \frac{Vddi}{Vdd0} \cdot \frac{(Vdd0 - Vt)^{\alpha 0}}{(Vddi - VT)^{\alpha i}}$$

$$\equiv Td0 \cdot Kv(vddi)$$

where Vdd0 is the reference power-source voltage used as the reference in calculating the delay time such as a power-source voltage used as the reference in extracting delay data from a cell library, Idsp0 is the drain saturation current in the P-channel MOSFET at the reference power-source voltage Vdd0, Td0 is the reference delay value for a logic circuit calculated at the reference power-source voltage Vdd0, $\alpha 0$ is the exponent $\alpha$ for the drain saturation current at the reference power-source voltage Vdd0, Idspi is the drain saturation current in the P-channel MOSFET at the power-source voltage Vddi, and $\alpha i$ is the exponent $\alpha$ for the drain saturation current Idsi at the power-source voltage Vddi.

As represented by the numerical expression (5), the delay time Td at the power-source voltage Vddi different from the reference power-source voltage Vdd0 can easily and reliably be calculated by multiplying the reference delay value Td0, obtained through the delay calculation, by a delay power-source coefficient Kv (Vddi) representing the relationship between the power-source voltage Vddi and the exponent α i.

Figure 26:
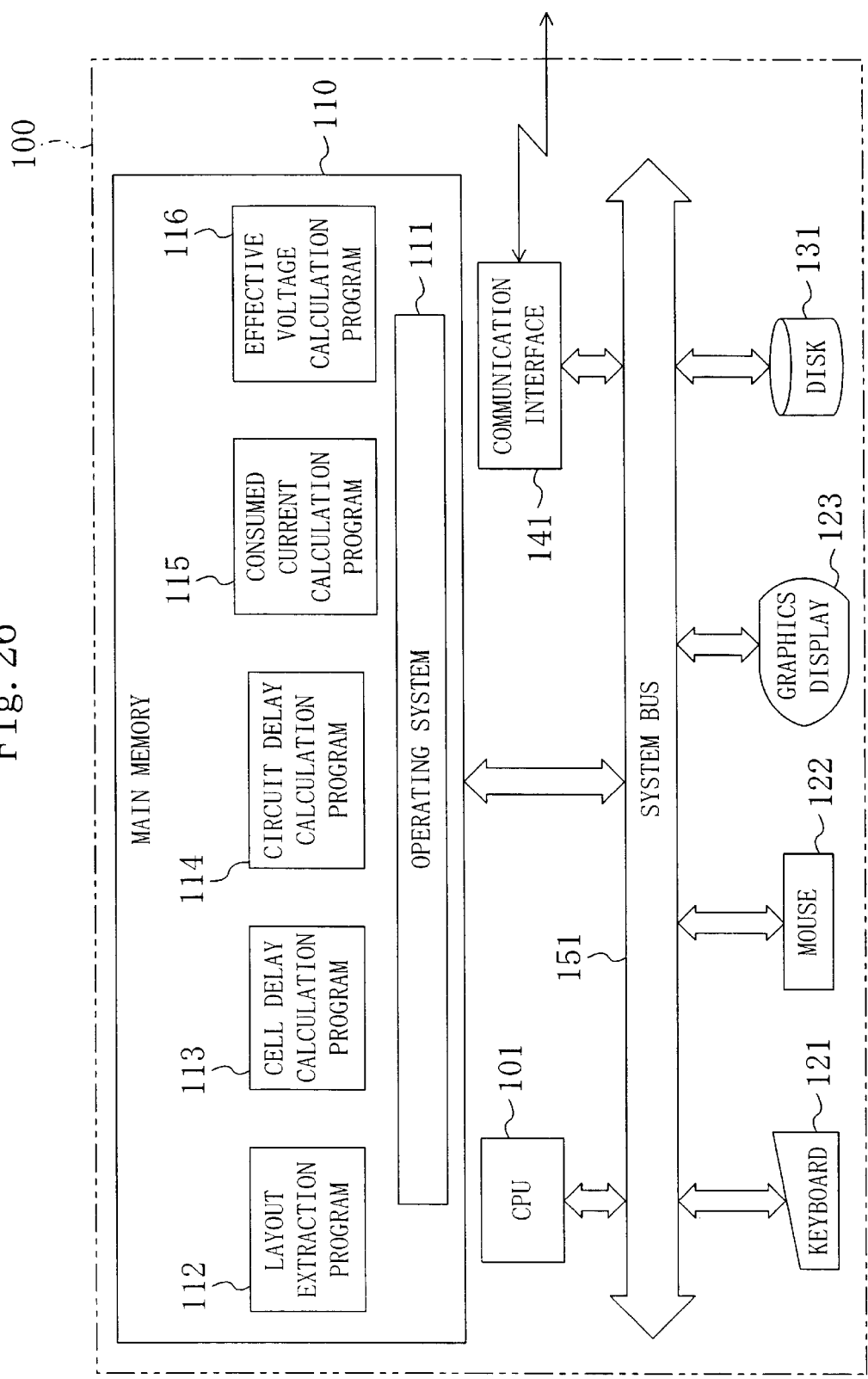
FIG. 26 is a block diagram illustrating an apparatus for calculating a delay for a logic circuit according to the present invention.

FIG. 26 is a block diagram of a delay calculating apparatus which performs the method of calculating a delay for a logic circuit according to the present invention. As shown in FIG. 26, a delay calculating apparatus 100 comprises: a central processor unit (CPU) 101 for executing respective programs stored in a main memory 110; a keyboard 121 for inputting text data; a mouse 122 for inputting figures and positional relationships of the figures; a graphic display 123 for displaying outputs of inputted text data or the figures; a storage disk 131 for storing programs and data for executing the method of calculating a delay for a logic circuit according to the present invention, which functions as a computer readable storage medium being external storing means, and a communication interface 141 for communicating with other compute systems.

All of the elements are connected with one another via a system bus 151. Also, data transfer (transmitting/receiving) is accomplished using the system bus 151.

The main memory 110 stores an operating system (OS) 111 and programs for performing the delay calculating method of the present invention, which method is divided into several operations respectively executed by the programs stored in the main memory 110.

The OS 111 can be any one of conventional operating systems such as UNIX™, Windows™ and LINUX™.

The programs of the present invention include: a layout data extraction program 112 for extracting parasitic resistances and parasitic capacitances of signal wirings or power-source lines from layout data; a cell delay calculation program 113 for calculating a delay coefficient used for changing a delay value based on an effective power-source voltage-which is applied to a circuit to be analyzed with respect to delay therein; a circuit delay calculation program 114 for calculating a delay value of the circuit to be analyzed based on cell delay data and output results supplied from the cell delay calculation program 113; a consumed current calculation program 115 for calculating consumed current of the circuit to be analyzed based on an amount of current consumed by a cell; and an effective power-source voltage calculation program 116 for calculating an effective power-source voltage which is applied to the circuit to be analyzed by calculating a voltage drop in the power-source line.

First Embodiment

Referring now to the drawings, a first embodiment of the present invention will be described.

Figure 3:
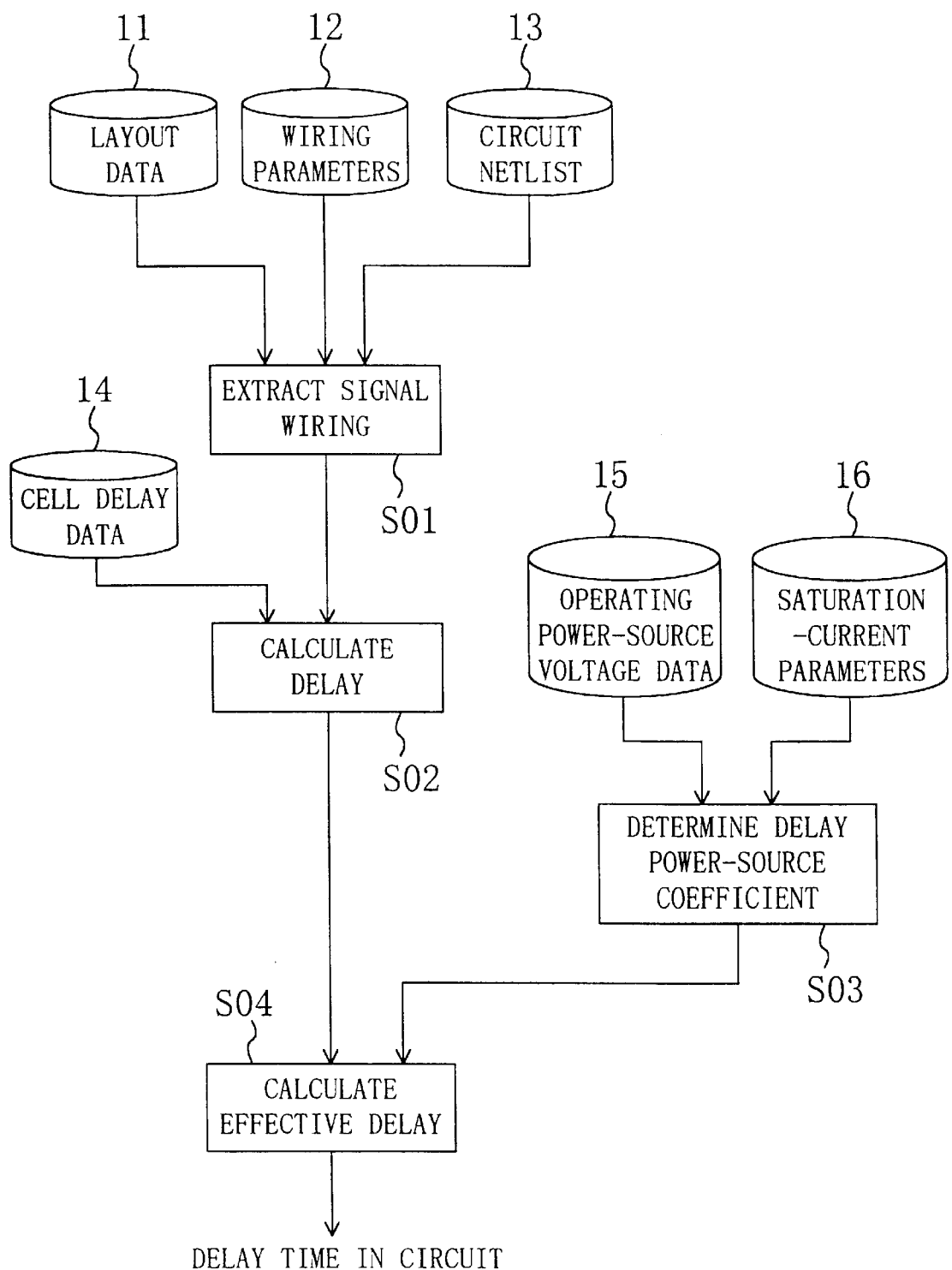
FIG. 3 illustrates a flow of operations in an apparatus for calculating a delay for a logic circuit according to a first embodiment of the present invention.

FIG. 3 illustrates the flow of operations in an apparatus for calculating a delay for a logic circuit according to the first embodiment.

The delay calculating method/apparatus according to the present embodiment utilizes the layout data extraction program 112, the cell delay calculation program 113 and the circuit delay calculation program 114, which are shown in FIG. 26.

First, as shown in FIG. 3, a variety of data sets required to calculate a delay in signal propagation time for a logic circuit are prepared in advance. In the drawing are shown: layout data. 11 for a circuit to be analyzed and for standard cells, which is stored in the main memory 110 or the storage disk 131 shown in FIG. 26 and functioning as layout-data supplying means; wiring parameters 12 stored in the main memory 110 or the storage disk 131 functioning as process-parameter-supplying means and consisting of a wiring resistance, a wiring capacitance and a wiring permeability per unit configuration; circuit netlist 13 stored in the main memory 110 or the storage disk 131 functioning as netlist supplying means describing the gate-level connections of the circuit to be analyzed; cell delay data 14 extracted at the reference power-source voltage Vdd0 and stored in the main memory 110 or the storage disk 131 functioning as library-data supplying means; specified operating power-source voltage data 15 stored in the main memory 110 or the storage disk 131 functioning as operating power-source voltage supplying means; and saturation-current parameters 16 such as the mobility of carries and the thickness of a gate oxide film which are stored in the main memory 110 or the storage disk 131 functioning as the process-parameter supplying means and used to determine a drain saturation current. Each of the layout data 11, the wiring parameters 12, the circuit netlist 13, the cell delay data 14, the specified operating power-source voltage data 15 and the saturation-current parameters 16 is provided in the form of a database.

Next, in a signal-wiring extracting step S01, signal-wiring extracting means extracts desired wiring resistance and capacitance for each signal node from the layout data 11, wiring parameters 12, and circuit netlist 13.

Next, in a delay calculating step S02, the delay calculating means uses the cell delay data 14 as the reference and the wiring resistance, wiring capacitance and wiring inductance extracted in the signal-wiring extracting step S01 to calculate a delay time for a logic circuit to be analyzed at the reference power-source voltage Vdd0. Wherein, calculation of the wiring inductance may be omitted when the operation frequency of the logic circuit is not exceeding 1 GHz.

Next, in a delay-power-source-coefficient determining step S03, delay-power-source-coefficient determining means calculates the drain saturation current Idspi in the P-channel MOSFET on the basis of the saturation-current parameters 16 such as the mobility of carriers and the thickness of a gate oxide film which are based on the specified operating power-source voltage data 15 (Vddi). Then, the delay-power-source-coefficient determining means calculates a ratio of the drain saturation current Idsp0 in the P-channel MOSFET at the reference power-source voltage Vdd0 to the drain saturation current Idspi in the P-channel MOSFET at the operating power-source voltage Vddi to determine the delay power-source coefficient Kv (Vddi) at the operating power-source voltage Vddi.

Next, in an effective-delay calculating step S04, effective-delay calculating means multiplies the delay time at the reference power-source voltage Vdd0 calculated by the delay calculating means by the delay power-source coefficient Kv (Vddi) calculated by the delay-power-source-coefficient determining means, as represented by the numerical expression (5), to determine a delay time at the operating power-source voltage Vddi.

In the present embodiment, the required steps are respectively executed by the programs shown in FIG. 26. More specifically, the procedure for the signal-wiring extracting step S01 is executed by the layout data extraction program 112, the procedure for the delay-power-source-coefficient determining step S03 is executed by the cell delay calculation program 113, and the procedures for the delay calculating step S02 and the effective-delay calculating step S04 are executed the circuit delay calculation program 114.

Figure 4:
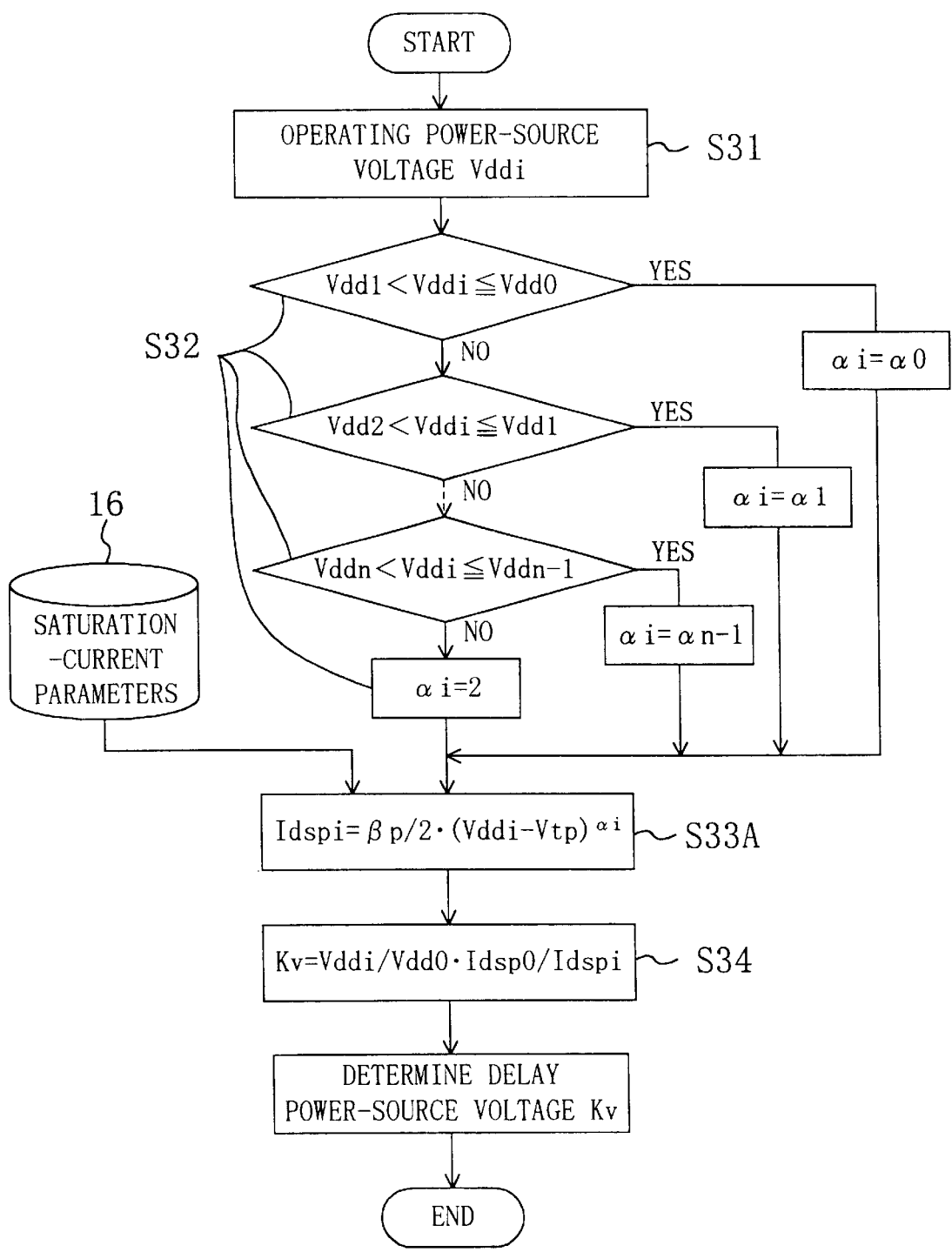
FIG. 4 illustrates a flow of operations for determining a delay power-source coefficient in the delay calculating apparatus according to the first embodiment.

FIG. 4 illustrates the flow of calculation illustrating in detail the delay-power-source-coefficient determining step S03. In the drawing, the foregoing numerical expression (4) is used to calculate the drain saturation current Idspi in the P-25 channel MOSFET so that the exponent αi in accordance with the operating power-source voltage Vddi is selected to determine the drain saturation current Idspi.

First, in an operating-power-source-voltage determining step S31, the specified operating power-source voltage Vddi is extracted from the operating power-source voltage data 15 shown in FIG. 3. Then, in an exponent determining step S32, the range in which the operating power-source voltage Vddi falls is selected from the predetermined ranges of the power-source voltage Vdd0, Vdd1, Vdd2, . . . , Vddn−1, and Vddn (n is an integer equal to or more than 2) such that the exponent αi at the operating power-source voltage Vddi is determined.

Next, in a drain-saturation-current determining step S33A, the drain saturation current Idspi at the operating power-source voltage Vddi is determined by using the saturation-current parameters 16 and the numerical expression (4).

Next, in a drain-saturation-current determining step S34, the power-source voltage coefficient (Vddi/Vdd0) which is a ratio of the operating power-source voltage Vddi to the reference power-source voltage Vdd0 and the current coefficient (Idsp0/Idspi) which is a ratio of the drain saturation current Idsp0 at the reference power-source voltage Vdd0 to the drain saturation current Idspi at the operating power-source voltage Vddi are calculated so that the product of the power-source voltage coefficient and the current coefficient is calculated to provide the delay power-source coefficient Kv (Vddi) at the operating power-source voltage Vddi.

As a specific method of defining a relationship between the operating power-source voltage Vddi and the exponent αi, a method of using a tabular model can be considered.

Thus, the dependency of the delay time on the power-source voltage can be calculated easily and reliably only by defining the relationship between the operating power-source voltage Vddi and the exponent αi at the operating power-source voltage Vddi.

The advantage of defining the relationship between the operating power-source voltage Vddi and the drain saturation current Idspi by using the exponent αi is that varying current characteristics can be plotted as a smooth curve with the use of a smaller number of data sets than used in directly defining the drain saturation current Idspi, since only the two factors of the operating power-source voltage Vddi and the exponent αi vary the drain saturation current Idspi.

Figure 5:
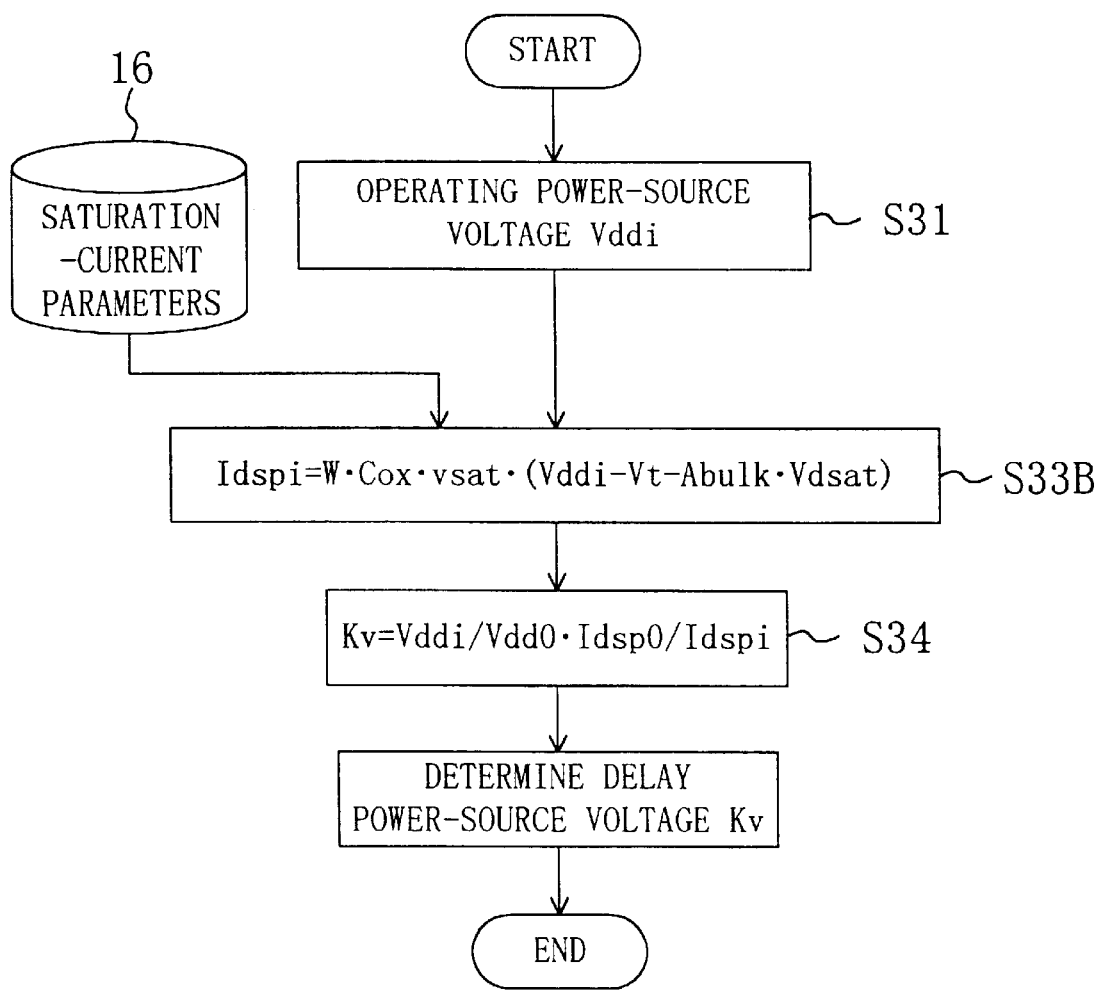
FIG. 5 illustrates the flow of operations for determining the delay power-source coefficient in the delay calculating apparatus according to the first embodiment.

FIG. 5 illustrates the flow of calculations for determining the delay power-source coefficient Kv (Vddi) from the relational expression of the operating power-source voltage vddi and the drain saturation current Idspi. In this case, the drain saturation current Idspi is represented based on the current equation in accordance with the SPICE transistor model BSIM3ver2 proposed by the University of California at Berkeley in the U.S., as shown in the following numerical expressions (6) and (7):

$$Idspi = W \cdot Cox \cdot vsat \cdot (Vddi - Vt - Abulk \cdot Vdsat) \quad (6)$$

$$Vdsat = Esat \cdot L \cdot \frac{Vddi - Vt}{Esat \cdot L + Vddi - Vt} \quad (7)$$

where the individual parameters are defined by
- vsat=saturation velocity of carriers
- W=gate width of MOSFET
- L=gate length of MOSFET
- Cox=capacitance per unit area of gate oxide film
- Vdsat=drain-to-source voltage at which drain current is saturated
- Abulk=coefficient of bulk charge effect (coefficient calculated based on the SPICE parameters)
- Esat=critical electric field with which velocity of carriers is saturated (value calculated based on the SPICE parameters)

FIG. 5 shows the procedures for determining the delay power-source coefficient. First, in the operating-power-source-voltage determining step S31, a specified operating power-source voltage Vddi is determined from the operating power-source voltage data 15 shown in FIG. 3. Then, in a drain-saturation-current determining step S33B, the drain saturation current Idspi at the operating power-source voltage Vddi is calculated in accordance with the saturation-current parameters 16 and with the numerical expressions (6) and (7).

The subsequent step is the same as the delay-power-source-coefficient determining step S34 shown in FIG. 4.

As described above, the dependency of the delay time for a logic circuit on the power-source voltage can easily be calculated by using delay data in the cell library calculated at a specified power-source voltage used as the reference by only defining the relationship between the operating power-source voltage Vddi and the drain saturation current Idspi in the P-channel MOSFET.

Although the present embodiment has used as an example the circuit block of the integrated circuit in the building block system employing the standard cells, a circuit block of a gate array or a custom-designed circuit block may also be used instead.

Second Embodiment

A second embodiment of the present invention will be described with reference to the drawings.

Figure 6:
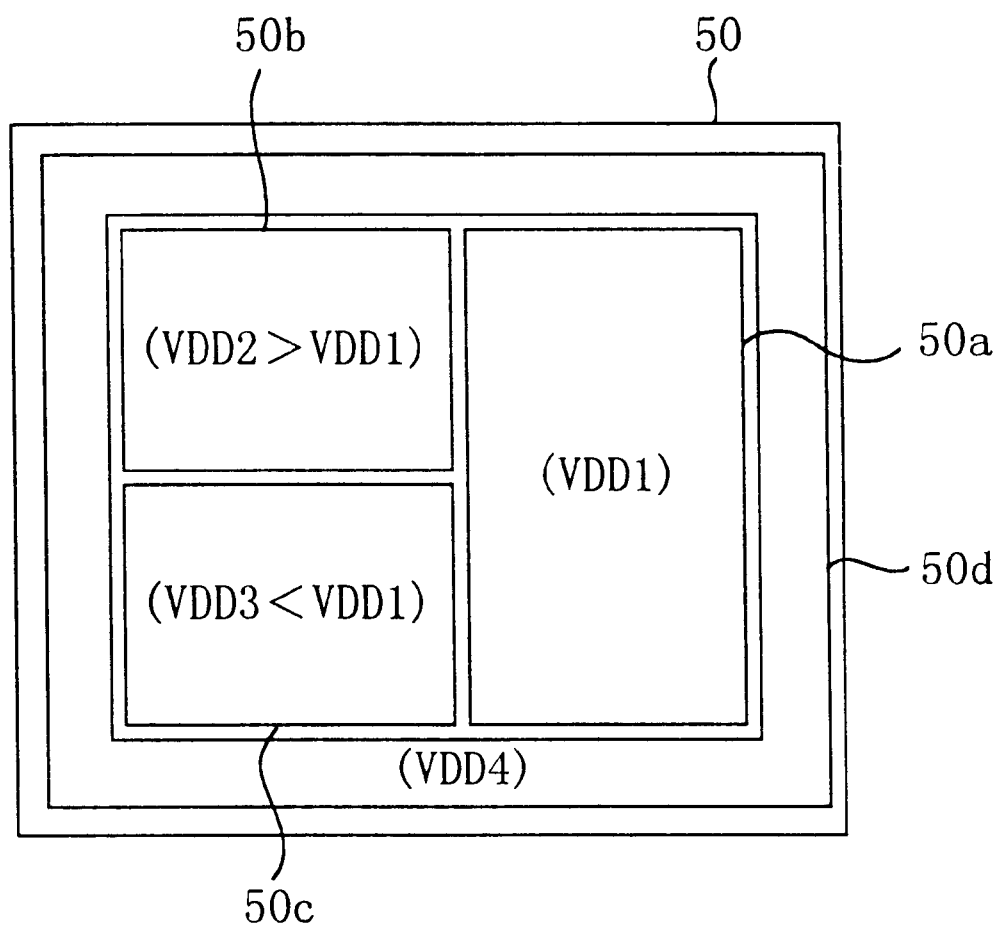
FIG. 6 shows the structure of an integrated circuit for which an apparatus for calculating a delay for a logic circuit according to a second embodiment of the present invention calculates a delay.

FIG. 6 shows an integrated circuit internally provided with circuit blocks operating at different power-source voltages, for which an apparatus for calculating a delay for a logic circuit according to the second embodiment will calculate a delay. In the drawing, the integrated circuit 50 for which the delay calculating apparatus according to the present embodiment calculates a delay is composed of a circuit block 50a operating at a first operating power-source voltage Vdd1, a higher-speed operating circuit block 50b required of higher-speed operation at a second operating power-source voltage Vdd2 higher than the first operating power-source voltage Vdd1, a lower-power circuit block 50c required of lower-power operation at a third operating power-source voltage Vdd3 lower than the first operating power-source voltage Vdd1, and an input/output circuit block 50d operating at a fourth operating power-source voltage Vdd4 determined by an external peripheral apparatus around the integrated circuit 50.

Figure 7:
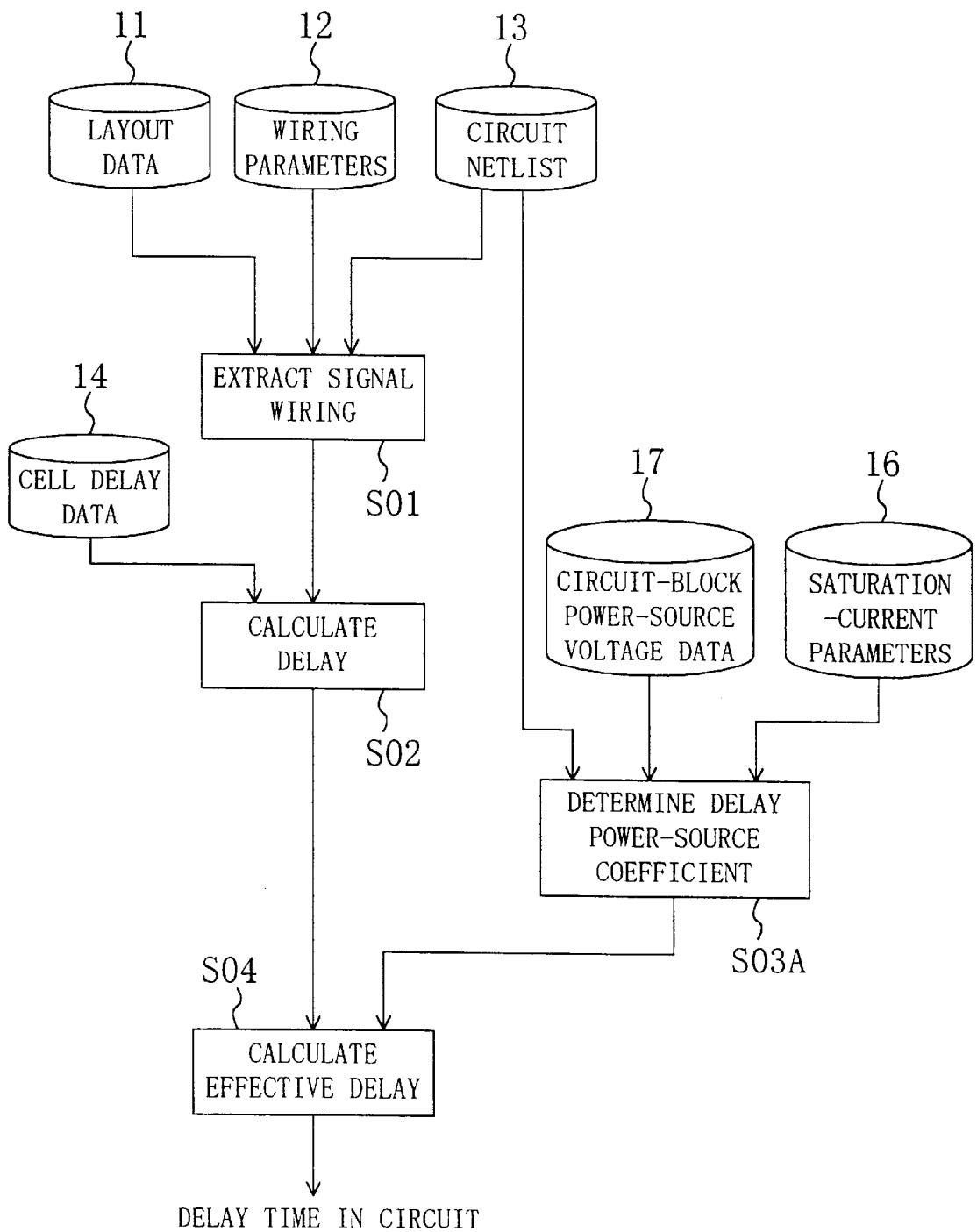
FIG. 7 illustrates a flow of operations in the delay calculating apparatus according to the second embodiment.

FIG. 7 illustrates the flow of operations in the delay calculating apparatus according to the second embodiment. As for like components shown in FIGS. 3 and 7, the description thereof will be omitted by providing like reference numerals. The delay calculating method/apparatus according to the present embodiment utilizes the layout data extraction program 112, the cell delay calculation program 113 and the circuit delay calculation program 114, which are shown in FIG. 26. The circuit-block operating power-source voltage data. 17 shown in the drawing is stored in the main memory 110 or the storage disk 131 functioning as the operating power-source voltage information supplying means and supplied to each of the circuit blocks 50a, 50b, 50c, and 50d as shown in FIG. 6.

Here, a description will be given to a step not performed in the first embodiment, which is a delay-power-source-coefficient determining step S03A. In the step S03A, the delay-power-source-coefficient determining means determines the delay power-source-coefficients Kv for the respective circuit blocks on the basis of the circuit-block operating power-source voltage data 17, of the saturation-current parameters 16 such as the mobility of carriers and the thickness of a gate oxide film based on the circuit-block operating power-source voltage data 17, and of the circuit netlist 13.

Next, in the effective-delay calculating step S04, the effective-delay calculating means determines delay times for the respective circuit blocks of the integrated circuit 50 by using the individual delay power-source coefficients Kv determined by using the numerical expression (5), similarly to the first embodiment.

Although the different operating power-source voltages have been used for the integrated circuit 50, the delay data 14 created at the reference power-source voltage Vdd0 is used till the delay calculating step S02 and the delay time can be compensated for in accordance with the individual operating power-source voltages in the final effective-delay calculating step S04. Consequently, it is no more necessary to use the cell library having delay data for each power-source voltage as has been used previously, resulting in reduced time required to create the library.

In the present embodiment, the required steps are respectively executed by the programs shown in FIG. 26. More specifically, the procedure for the signal-wiring extracting step S01 is executed by the lay out data extraction program 112, the procedure for the delay-power-source-coefficient determining step S03A is executed by the cell delay calculation program 113, and the procedures for the delay calculating step S02 and the effective-delay calculating step S04 are executed by the circuit delay calculation program 114.

Thus, according to the present embodiment, a delay for the integrated circuit 50 composed of circuit blocks supplied with different operating power-source voltages for higher-speed operation and lower-power consumption can be calculated easily and reliably by using the cell delay data 14 created at the standard power-source voltage.

Third Embodiment

A third embodiment of the present invention will be described with reference to the drawings.

The present embodiment will describe a delay calculation method and a delay calculating apparatus in the case where voltage variations occur on power-source lines in an integrated circuit and a power-source voltage applied to the power-source terminal of the integrated circuit is different from an effective power-source voltage applied to an internal circuit thereof.

The description will be given first to the influence of a delay in signal propagation time resulting from voltage variations induced by wiring parasitic on the VDD and VSS lines with reference to FIG. 8.

A consideration will be given to a typical integrated circuit wherein m (m is an integer equal to or more than 1) circuit blocks are connected to each of n (n in an integer equal to or more than 1) pairs of VDD and VSS lines. As shown it FIG. 8, it is assumed that the m circuit blocks are connected to the n (in this example, n=2) pairs of VDD and VSS lines. A power-source voltage at the reference potential Vdd0 is applied to the power-source terminal of the inte-grated.circuit and each of the m circuit blocks is connected to the power-source terminal. The average current consumed by each of the circuit blocks 1, . . . , and m is Ii (i is an integer of 1, 2, . . . , m−1, and m). For simplicity, the VDD and VSS lines provided between the individual circuits are assumed to have the same lengths and widths. The wiring resistance, wiring capacitance and wiring inductance of each of the VDD and VSS lines is assumed to be R, C and L, respectively.

Figure 8:
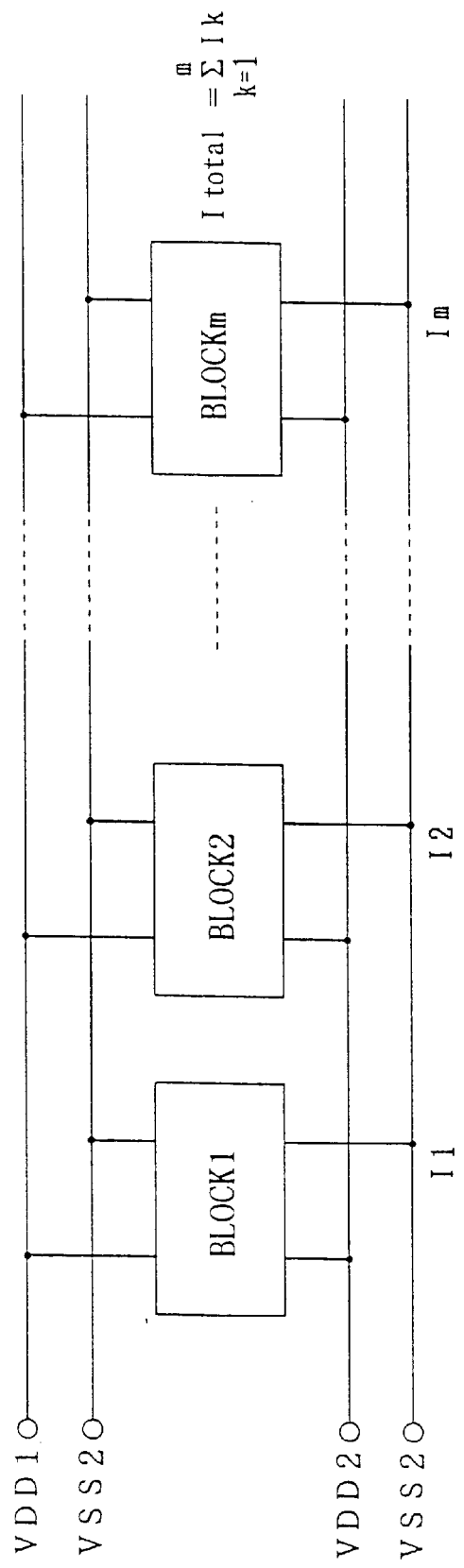
FIG. 8 is a circuit diagram of an integrated circuit for which an apparatus for calculating a delay for a logic circuit according to a third embodiment of the present invention calculates a delay.
Figure 9:
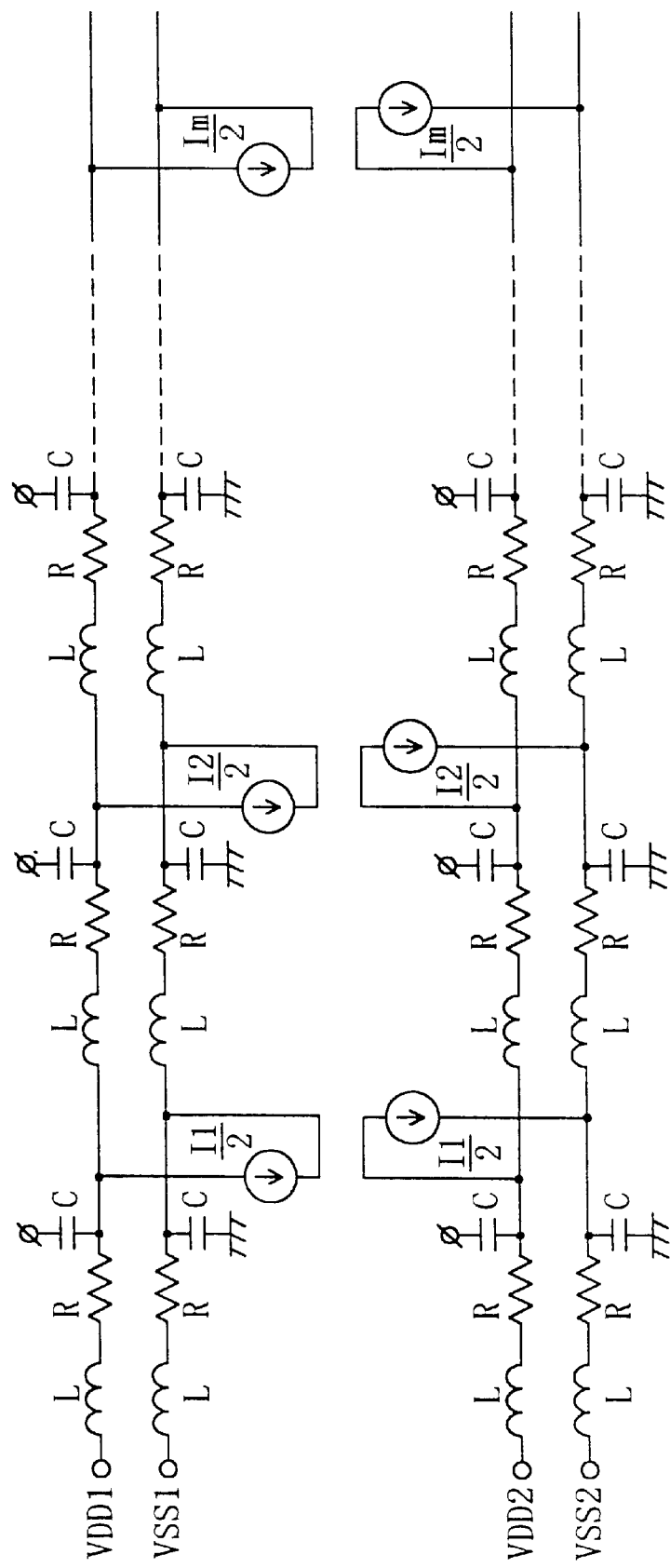
FIG. 9 is a circuit diagram of a first equivalent circuit to the integrated circuit for which the delay calculating apparatus according to the third embodiment calculates a delay.

FIG. 9 shows a first equivalent circuit to the integrated circuit shown in FIG. 8. By way of example, the average current I1 consumed by the block 1 is assumedly composed of two current sources of I1/2 connected in parallel-Each of the parasitic on the power-source lines is composed of a wiring resistance, a wiring inductance, and a wiring capacitance. A capacitance resulting from a diode junction between the source and substrate of a MOSFET is connected to the first equivalent circuit, resulting in the equivalent circuit with the powersource lines as shown in FIG. 9.

Figure 10:
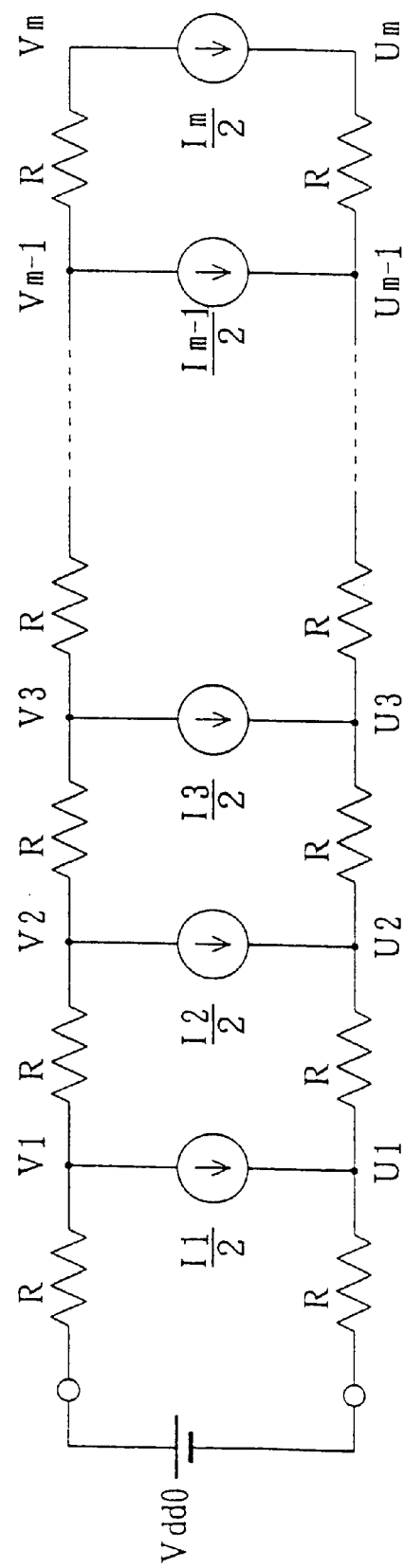
FIG. 10 is a circuit diagram of a second equivalent circuit to the integrated circuit for which the delay calculating apparatus according to the third embodiment calculates a delay.

FIG. 10 shows a second equivalent circuit obtained by ultimately simplifying the integrated circuit shown in FIG. 8, in which only one pair of power-source lines are used. With a view to simplifying the parasitic on the power-source lines, the present embodiment uses the second equivalent circuit as an analytic model for calculating a voltage drop due to wiring resistances on the VDD and VSS lines. By using the second equivalent circuit, shown in FIG. 10, a potential Vm at the m-th node of the VDD line at a largest distance from a power source and a potential Um at the m-th node of the VSS line at a largest distance from a power source are calculated.

If the Kirchhoff's current law is applied to potentials V1, V2, . . . , and Vm at the individual nodes of the VDD line in the circuit blocks 1, and m shown in FIG. 8, the following relational expression (8) is provided:

(8)

$$\frac{Vdd0 - V1}{R} = \frac{I1}{n} + \frac{V1 - V2}{R} \quad \text{(i)}$$

$$\frac{V1 - V2}{R} = \frac{I2}{n} + \frac{V2 - V3}{R} \quad \text{(ii)}$$

$$\frac{Vm - 2 - Vm - 1}{R} = \frac{Im - 1}{n} + \frac{Vm - 1 - Vm}{R} \quad \text{(m-1)}$$

$$\frac{Vm - 1 - Vm}{R} = \frac{Im}{n} \quad \text{(m)}$$

After adding up the respective right sides of the equations (i), (ii), –, (m-1), and (m) and the respective left sides thereof, the equations are solved for the potential Vm at the m-th node of the VDD line to provide the following numerical expression(9)

$$Vm = Vdd0 - R \cdot \sum_{k=1}^{m} k \cdot \frac{Ik}{n} \quad (9)$$

The foregoing method used to calculate the potential Vm at the m-th node of the VDD line is also used to calculate the potential Um at the m-th node of the VSS line to provide the following numerical expression (10):

$$Um = R \cdot \sum_{k=1}^{m} k \cdot \frac{Ik}{n} \quad (10)$$

A voltage drop on the VDD line is represented by the difference (Vdd0–Vm) between the reference power-source voltage Vdd0 and the potential Vm at the m-th node of the VDD line. On the other hand, a voltage drop (rise) on the VSS line is represented by the potential Um at the m-th node of the VSS line. The sum of the two corresponds to the voltage drop on the VSS line. If the wiring resistance R is represented by using a wiring sheet resistance ps, a line width W, and a line length L0, the voltage drop Vdrop is represented by the following numerical expression (11):

$$Vdrop = (Vdd0 - Vm) + Um \quad (11)$$

$$= 2R \cdot \sum_{k=1}^{m} k \cdot \frac{Ik}{n}$$

$$= 2\rho s \cdot \frac{L0}{W} \cdot \sum_{k=1}^{m} k \cdot \frac{Ik}{n}$$

An effective power-source voltage Vddeff actually applied to each of the circuit blocks 1, and m is derived from the difference between the reference power-source voltage Vdd0 applied to the power-source terminal and the voltage drop Vdrop, which is represented by the following numerical expression (12):

$$Vddeff = Vdd0 - 2\rho s \cdot \frac{L0}{W} \cdot \sum_{k=1}^{m} k \cdot \frac{Ik}{n} \quad (12)$$

By way of example, the effective power-source voltage Vddeff it will be calculated by using a specific integrated circuit.

Figure 11A:
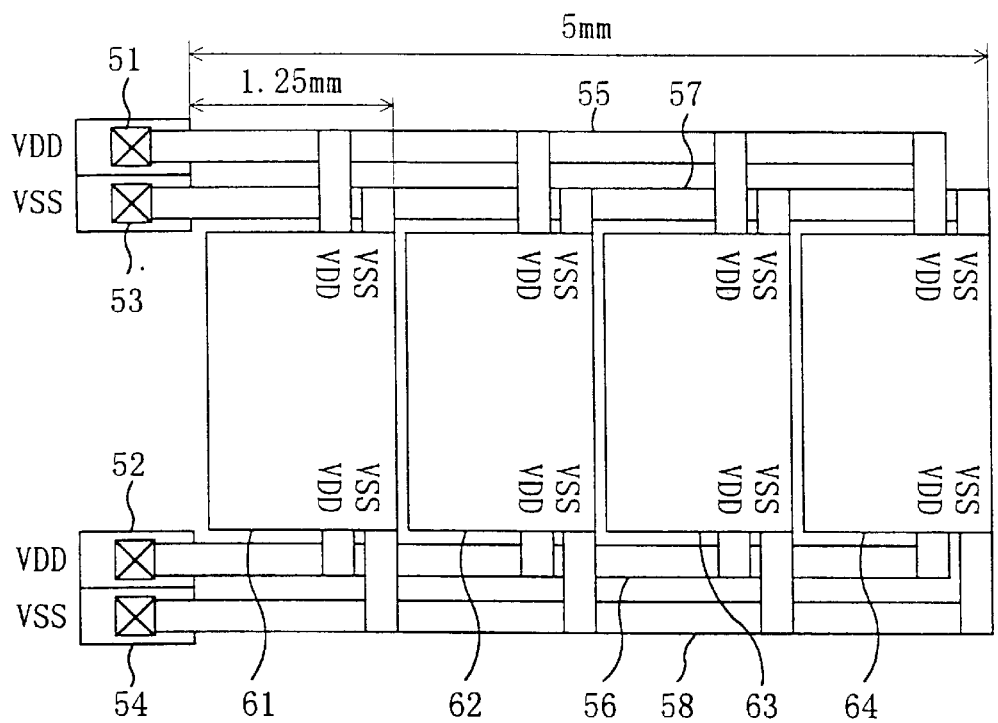
FIG. 11(a) shows a layout of the integrated circuit for which the delay calculating apparatus according to the third embodiment calculates a delay.

FIG. 11(a) shows a layout of the integrated circuit for which the effective power-source voltage Vddeff is to be calculated. Here, only wiring resistance is considered as a parasitic on a power-source line, similarly to the case shown in FIG. 10. As shown in FIG. 11(a), a first VDD terminal 51 is connected to a first VDD line 55 and a second VDD terminal 52 is connected to a second VDD line 56. A first VSS terminal 53 is connected to a first VSS line 57 and a second VSS terminal 54 is connected to a second VSS line 58. First, second, third, and fourth circuit blocks 61, 62, 63, and 64 are connected to the first and second VDD lines 55 and 56 and to the first and second VSS lines 57 and 58, respectively.

The integrated circuit shown in FIG. 11(a) is obtained by adding the first, second, third, and fourth circuit blocks 61, 62, 63, and 64 and two pairs of VDD lines and VSS lines to the integrated circuit shown in FIG. 8. The line length of each of the VDD and VSS lines is 5 mm, which is equivalent to the line length L0 of 1.25 mm per unit block of each of the VDD and VSS lines. In the integrated circuit shown in FIG. 11(a), the sheet resistance ps of each of the first and second VDD lines 55 and 56 and of the first and second VSS lines 57 and 58 is 50 mΩ/.

Figure 11B:
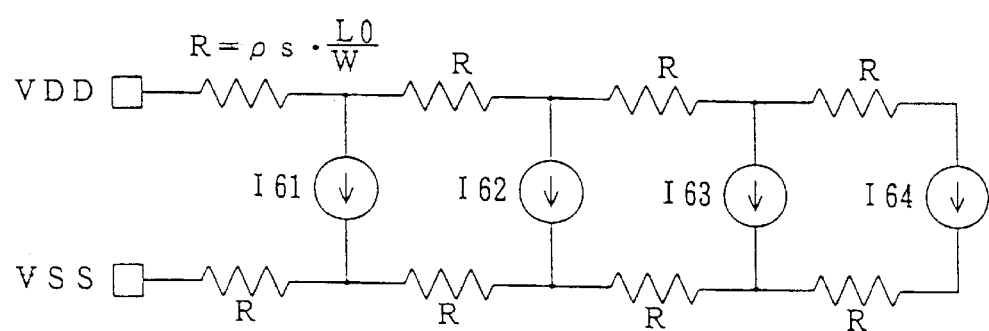
FIG. 11(b) is a circuit diagram of an equivalent circuit to the integrated circuit for which the delay calculating apparatus according to the third embodiment calculates a delay.

The integrated circuit shown in FIG. 11(b) represents an equivalent circuit to the integrated circuit shown in FIG. 11(a), in which respective average consumed currents flowing through the first, second, third, and fourth blocks 61, 62, 63, and 64 are designated by I61, I62, I63, and I64.

Figure 12:
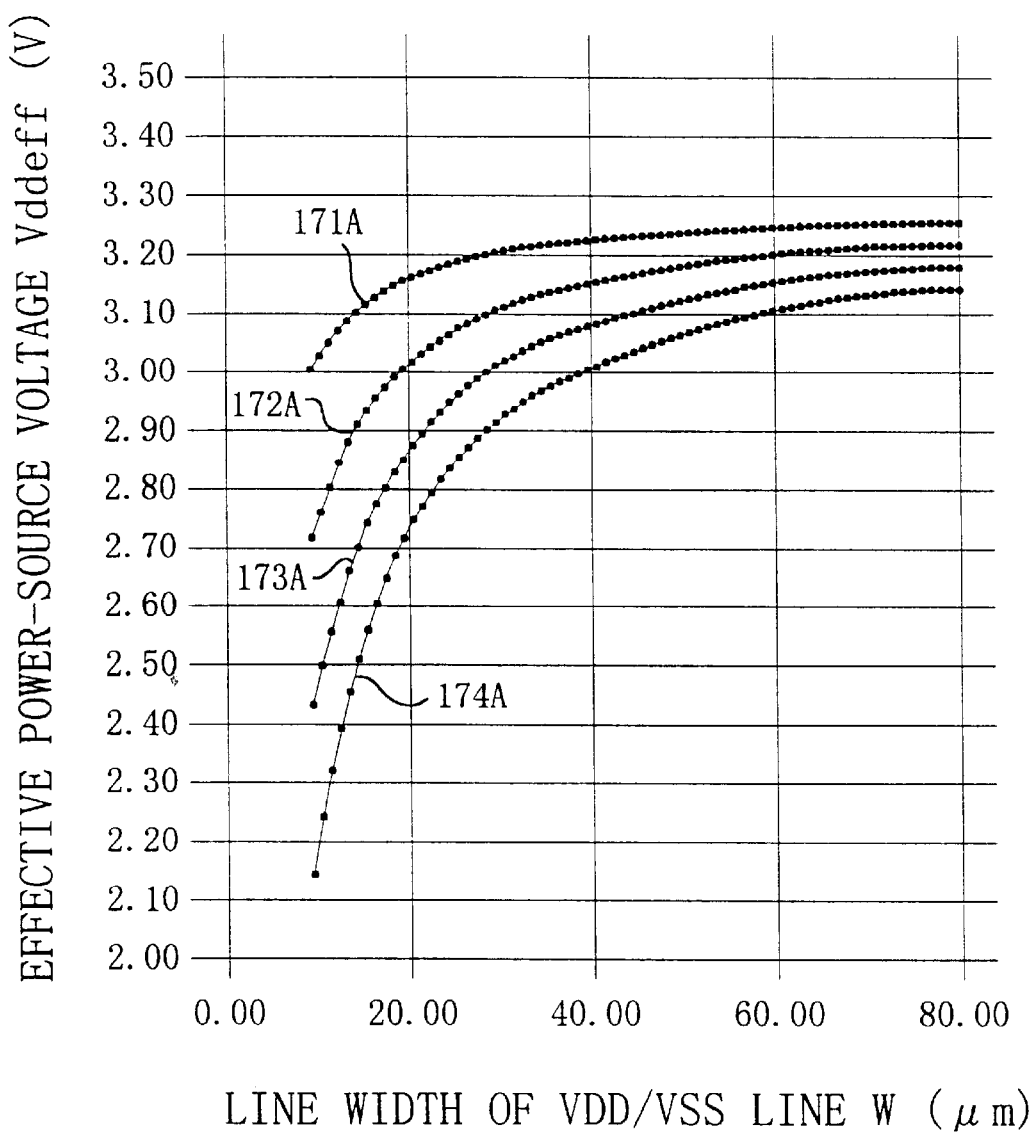
FIG. 12 is a graph representing the relationship between the width of a VDD/VSS line and an effective power-source voltage according to the third embodiment.

FIG. 12 is a graph representing the relationship between the line width W of each of the VDD and VSS lines and the effective power-source voltage Vddeff, which shows the result of calculation whereby the effective power-source voltage Vddeff is calculated by using the numerical expression (12) in the case where the respective average currents I61, I62, I63, and I64 consumed by the circuit blocks 61, 62, 63, and 64 are assumed to be equal. In FIG. 12, reference numerals 171A, 172A, 173A, and 174A designate the cases where the consumed currents are 5 mA, 10 mA, 15 mA, and 20 mA, respectively.

Figure 13:
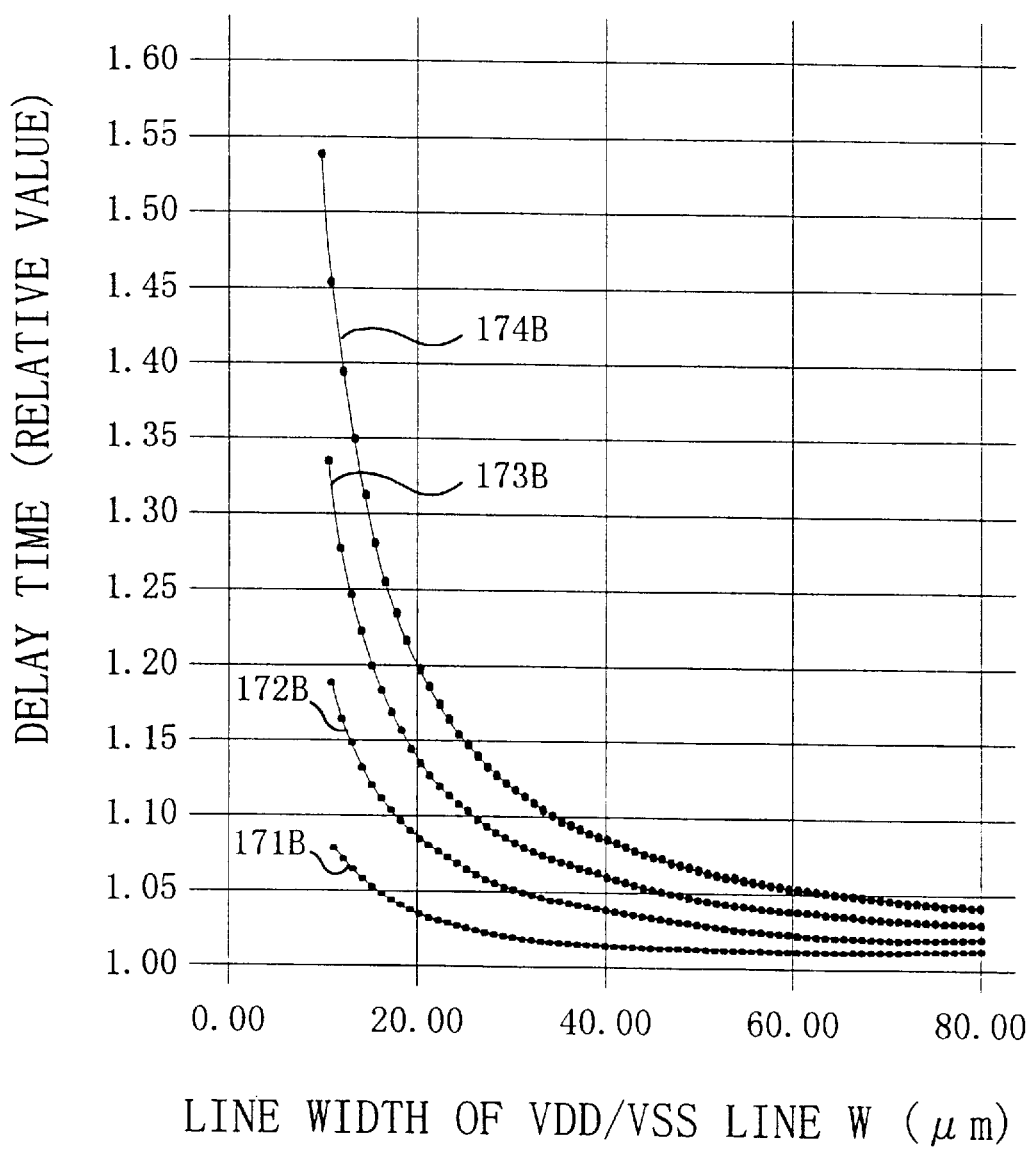
FIG. 13 is a graph representing the relationship between the width of the VDD/VSS line and a delay time expressed in a relative value according to the third embodiment.

FIG. 13 is a graph representing a relationship between the width. W of the VDD/VSS line and a delay time expressed in a relative value. The graph was obtained by plotting the results of calculations performed on the assumption that the average currents I61, I62, I63, and I64 consumed by the four circuits in the respective circuit blocks 61, 62, 63, and 64 are equal. In FIG. 13, reference numerals 171B, 172B, 173B, and 174B designate the cases where the consumed currents are 5 mA, 10 mA, 15 mA, and 20 mA, respectively.

Specifically, the calculation of the effective power-source voltage Vddeff using the numerical expression (12) is followed by the substitution of the effective power-source voltage Vddeff in the gate-to-source voltage Vgs of the numerical expression (4) for calculating the drain saturation current in the P-channel MOSFET and, thereafter, the delay time in a relative value (Kv (Vdd)) is calculated by using the numerical expression (5) for calculating a delay time.

In the conventional design of an integrated circuit, the power-source voltage VDD and ground voltage VSS thereof are assumed to be ideal power sources so that power-source voltages applied to the VDD and VSS terminals are assumed to be equal to the power-source voltage VDD and ground voltage VSS, respectively.

However, in the case where four circuits each consuming an average current of 10 mA are connected to the VDD and VSS lines with a line width of 30 µm, e.g., the sum of the voltage variations on the VDD and VSS lines corresponds to a voltage drop of about 0.2 V, when the power-source voltage VDD is 3.3 V, as indicated by the curve 172A in FIG. 12. On the other hand, an increase in delay time becomes 5% or more as indicated by the curve 172B in FIG. 13. If high-speed operation at a frequency of 100 MHz or more is to be achieved, consumed currents are increased so that delay variations due to the voltage variations on the VDD and VSS lines become no more negligible.

In a process in which micro-fabrication such as a 0.5–9 µm CMOS process is required, the number of metallization layers is increased for achieving higher integration and the thickness of each metallization layer tends to be smaller for facilitating the planarization of an insulating film between the metallization layers. As a result, the sheet resistance of each metallization layer is increased so that the voltage variations on the VDD and VSS lines tend to increase.

Figure 14:
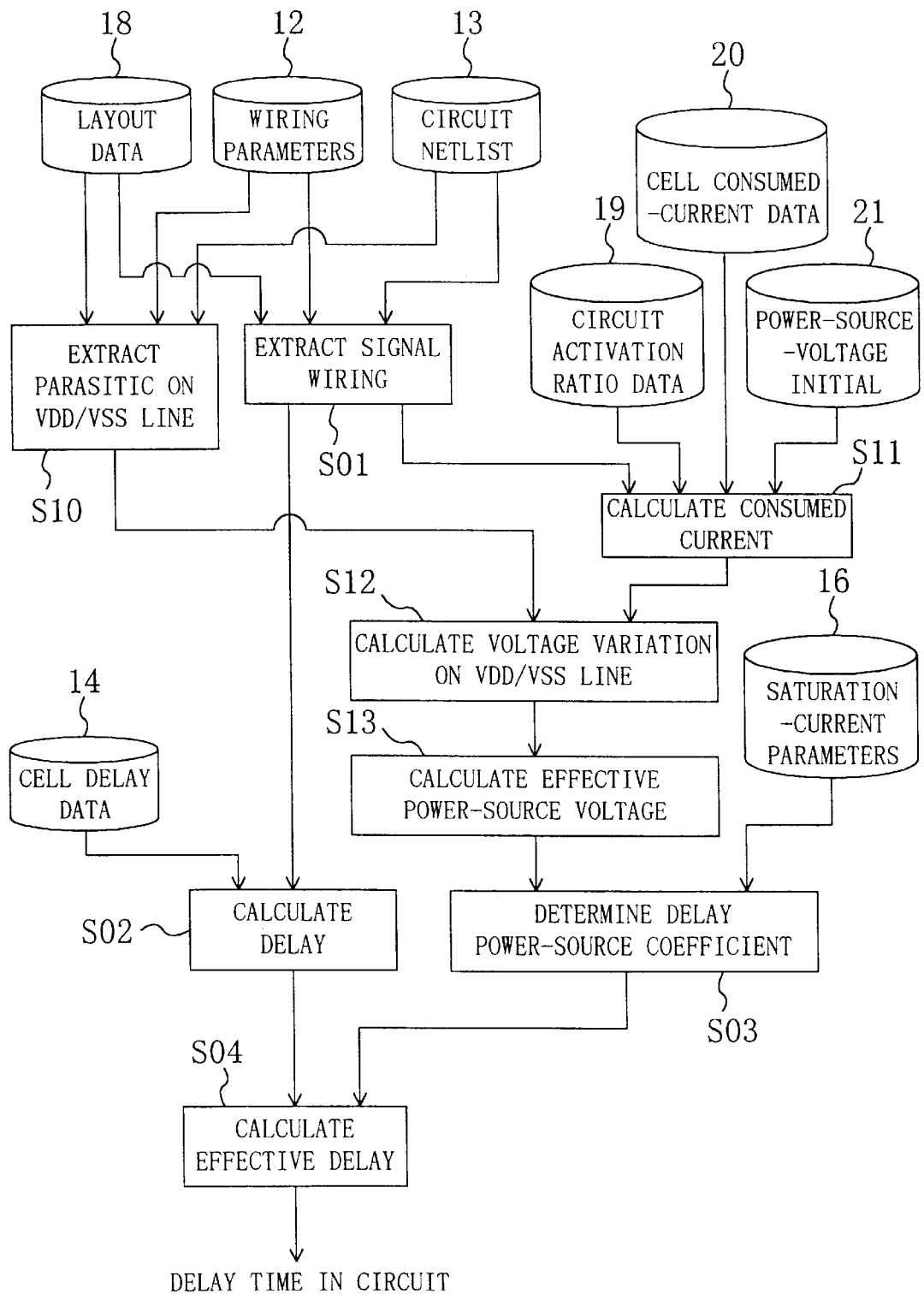
FIG. 14 illustrates a flow of operations in the delay calculating apparatus according to the third embodiment.

FIG. 14 illustrates the flow of operations in the delay calculating apparatus according to the third embodiment, in which voltage variations on the VDD and VSS lines of a logic circuit have been considered. As for like components as shown in FIGS. 3 and 14, the description thereof will be omitted by providing like reference numerals.

The delay calculating method/apparatus according to the present embodiment utilizes the layout data extraction program 112, the cell delay calculation program 113, the circuit delay calculation program 114, the consumed current calculation program 115 and the effective power-source voltage calculation program 116, which are shown in FIG. 26.

As shown in FIG. 14, the layout data 18 is for the integrated circuit for which a delay time is to be calculated and has information on the placement and routing of the VDD and VSS lines in addition to the layout data for standard cells and interconnections. Circuit activation ratio data 19 has information on a switching rate at which a current at each node on the circuit netlist 13 is switched. The cell consumed-current data 20 represents the current consumed by a standard cell used for a logic circuit. A power-source-voltage initial value 21 is set and applied to the integrated circuit for which a delay time is to be calculated. Each of the layout date 18, the circuit activation ratio data 19, the cell consume-current data 20 and the power-source-voltage initial value 21 is provided in the form of database on the main memory 110 or the disk 131 shown in FIG. 26.

The operation of the delay calculating apparatus thus constituted will be described.

First, in a power-source-line-wiring-parasitic extracting step S10, power-source-wiring extracting means extracts wiring parasitic on the power-source lines connected to the integrated circuit to be analyzed and composed of the VDD and VSS lines by using the layout data 18, the wiring parameters 12, and the circuit netlist 13 as well as netlist for logic elements connected to the VDD and VSS lines. On the other hand, a wiring parasitic is extracted in the signal-wiring extracting step S01.

Subsequently, in a consumed-current calculating step S11, the consumed-current calculating means calculates a current consumed by the integrated circuit by using the wiring parasitic extracted in the signal-wiring extracting step S01, the circuit activation ratio data 19, the cell consumed-current data 20, and the power-source-voltage initial value 21.

To calculate the current Idgate consumed by each gate, e.g., the following numerical expression (13) is used:

$$Idgate = Icl + Ipen = Ks \cdot f \cdot Cl \cdot Vdd + \frac{Ks \cdot Ipp \cdot Ts}{2} \quad (13)$$

where the first term Icl is the current required by a cell to charge or discharge a load capacitance, Ks is the circuit activation ratio, f is the operating frequency, Cl is the load capacitance, Vdd is the power-source voltage, and the second term Ipen is the penetration current flowing between the VDD and VSS lines upon switching the cell. The penetration current Ipen is obtained by triangular-approximation on the assumption that a maximum penetration current Ipp is achieved when a current flowing through a pull-up circuit composed of a PMOS and a current flowing through a pull-down circuit composed of an NMOS have equal and maximum values during a switching period Ts during which an input voltage to the cell is switched from VSS to VDD or from VDD to VSS. The switching period Ts is determined by the driving ability, wiring parasitic of the output load of the cell.

The circuit activation ratio Ks can be calculated by, e.g., performing a simulation at the stage of creating a gate-level netlist through logic synthesis from a functional description at the stage of functional design in the process of designing the integrated circuit and by calculating the switching frequency at each node. Since the circuit activation ratio Ks is not dependent on the Wiring parasitic or on the current data in the cell library, the circuit activation ratio Ks at each node can be calculated by supplying a test pattern to the netlist even when no information is provided on the load capacitance or resistance capacitance of actual wiring. Once the circuit activation ratio Ks is determined, even when the manufacturing process is changed, when the operating condition such as operating frequency or power-source voltage is changed, and when the configuration of the layout is changed properly as in a soft macro library, it is no more necessary to resupply another test pattern to the netlist and simulate again the consumed current Idgate again.

Thus, by using the numerical expression (13), the consumed current Idgate can be calculated statically and advantageously from the circuit activation ratio, wiring parasitic, and consumed current data for the cell, which have been calculated previously.

In some cases, the probability of a logic value making a transition, which is based on a logic function contained in the netlist, may be used as the circuit activation ratio Ks. A description will be given to the cases with reference to the circuit diagram of a full adder shown in FIG. 15(*a*) and to the truth tables shown in FIGS. 15(*b*) and 15(*c*). As shown in FIG. 15(*a*), the full adder according to the present embodiment is composed of an intermediate-sum generator A for outputting an intermediate sum s and an intermediate-carry generator B for outputting an intermediate carry co.

Figures 15A, 15B, 15C:
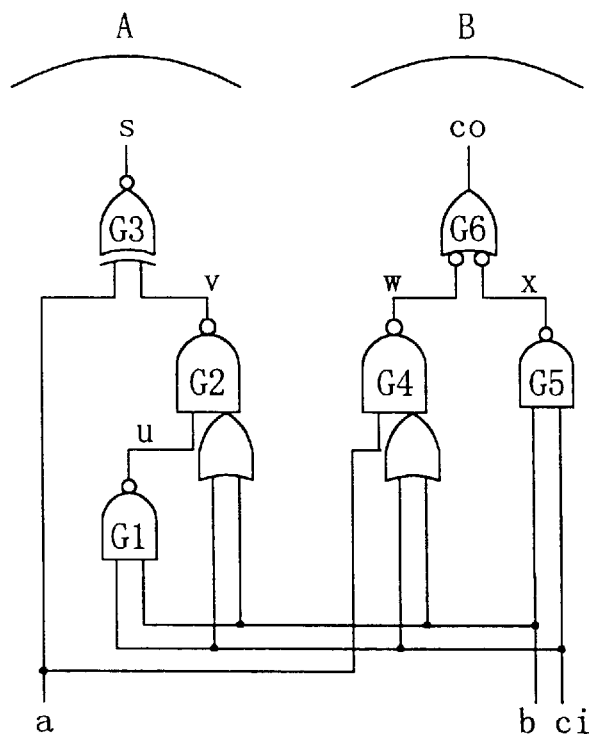
FIG. 15(a) is a circuit diagram of a full adder exemplifying a logic circuit according to the third embodiment.
FIGS. 15(b) and 15(c) show truth tables of the full adder exemplifying the logic circuit according to the third embodiment.

The intermediate-sum generator A is composed of: a first NAND gate GI having one input terminal connected to a node b, the other input terminal connected to a node ci, and an output terminal connected to a node u; a first NAND-OR composite gate G2 having one input terminal connected to the node b, another input terminal connected to the node ci, the remaining input terminal connected to the node u, and an output terminal connected to a node v; and an EX-NOR gate 3 having one input terminal connected to a node a; the other input terminal connected to the node v, and an output terminal connected to a node s. FIG. 15(b) shows the truth table of the intermediate-sum generator A.

The intermediate-carry generator B is composed of: a second NAND-OR composite gate G4 having one input terminal connected to the node b, another input terminal connected to the node ci, the remaining input terminal connected to the node a, and an output terminal connected to a node w; a second NAND gate G5 having one input terminal connected to the node b, the other input terminal connected to the node ci, and an output terminal connected to a node x; and a third NAND gate G6 having one input terminal connected to the node w, the other input terminal connected to the node x, and an output terminal connected to a node co. FIG. 15(c) shows the truth table of the intermediate-carry generator B.

As shown in FIG. 15(b), the probabilities of the logic value at the node u being "1" and "0" are ¾ and ¼, respectively. If the probability of the logic value at the node u making a transition is calculated based on the results, the probability of a transition from "1" to "0" is ¾×¼=3/16, while the probability of a transition from "0" to "1" is ¼×¾=3/16. At each of the other nodes v, w, and x, the probability of a transition from "0" to "1" or from "1" to can also be calculated in the same manner.

The transition from "0" to "1" indicates charging from the VDD line caused by the switching of the P-channel MOSFET in a logic element, during which a voltage drop occurs on the VDD-line. On the other hand, the transition from "1" to "0" indicates discharging onto the VSS line caused by the switching of the N-channel MOSFET in a logic element, during which a voltage drop (actually a voltage rise) occurs on the VSS line. By thus calculating the probability of a logic value making a transition based on the logic function contained in the net list, the respective currents flowing through the VDD and VSS lines can be calculated in accordance with the calculated transition probability.

It will be appreciated that the consumed current Idgate may also be calculated dynamically by using a test pattern.

Next, in a power source-line-voltage-variation calculating step S12, voltage variations on the VDD and VSS lines are calculated by using the consumed currents calculated by the consumed-current calculating means in the consumed-current calculating step Sil and the wiring parasitic extracted by the power-source-wiring extracting means in the power-source-line-wiring-parasitic extracting step S10. After that, in an effective-power-source-voltage calculating step S13, effective-power-source-voltage calculating means calculates the effective-power-source voltage Vddeff which is an effective power-source voltage applied to the circuit.

Thereafter, the procedures in the delay calculating step S02, in the delay-power-source-coefficient determining step S03, and in the effective-delay calculating step S04 are sequentially performed, similarly to the first embodiment, thereby calculating an effective delay time for the integrated circuit to be analyzed.

In the present embodiment, the required steps are respectively executed by the programs shown in FIG. 26. More specifically, the procedures for the signal-wiring extracting step S01 and the power-source-line-wiring-parasitic extracting step S10 are executed by the layout data extraction program 112; the procedure for the delay-power-source-coefficient determining step S03 is executed by the cell delay calculation program 113; the procedures for the delay calculating step S02 and the effective-delay calculating step S04 are executed by the circuit delay calculation program 114; the procedure for the consumed-current calculating step S11 is executed by the consumed current calculation program 115; and the procedures for the power-source-line-voltage-variation calculating step S12 and the effective-power-source-voltage calculating step S13 are executed by the effective power-source voltage calculation program 116.

Thus, according to the present embodiment, an increased delay time resulting from voltage variations on the VDD and VSS lines produced in an integrated circuit with a smaller feature size can be estimated reliably.

As the circuit activation ratio Ks, the switching frequency may also be used directly instead of the transition probability.

Although the present embodiment has calculated a delay based on design data-after the completion of layout design, an increased delay time can be estimated by calculating a wiring resistance based on data estimated from a floor plan prior to the layout design.

Although a circuit in a building block system employing standard cells has been postulated, a circuit such as a gate array may also be used.

Fourth Embodiment

A fourth embodiment of the present invention will be described with reference to the drawings.

In the third embodiment the consumed current has been treated as direct current. However, since an actual consumed current dynamically varies with the operating time of the circuit, the use of the postulated direct consumed current may result in underestimation or overestimation of a voltage variation on the VDD/VSS line.

An object of the present embodiment is to increase the accuracy of the effective power-source voltage through the introduction of a method of and means for calculating a consumed current and a voltage variation on the power-source line in accordance with the operating time of the circuit by using a static method such that the consumed current dynamically varying in the circuit in actual operation is treated properly.

Figure 16:
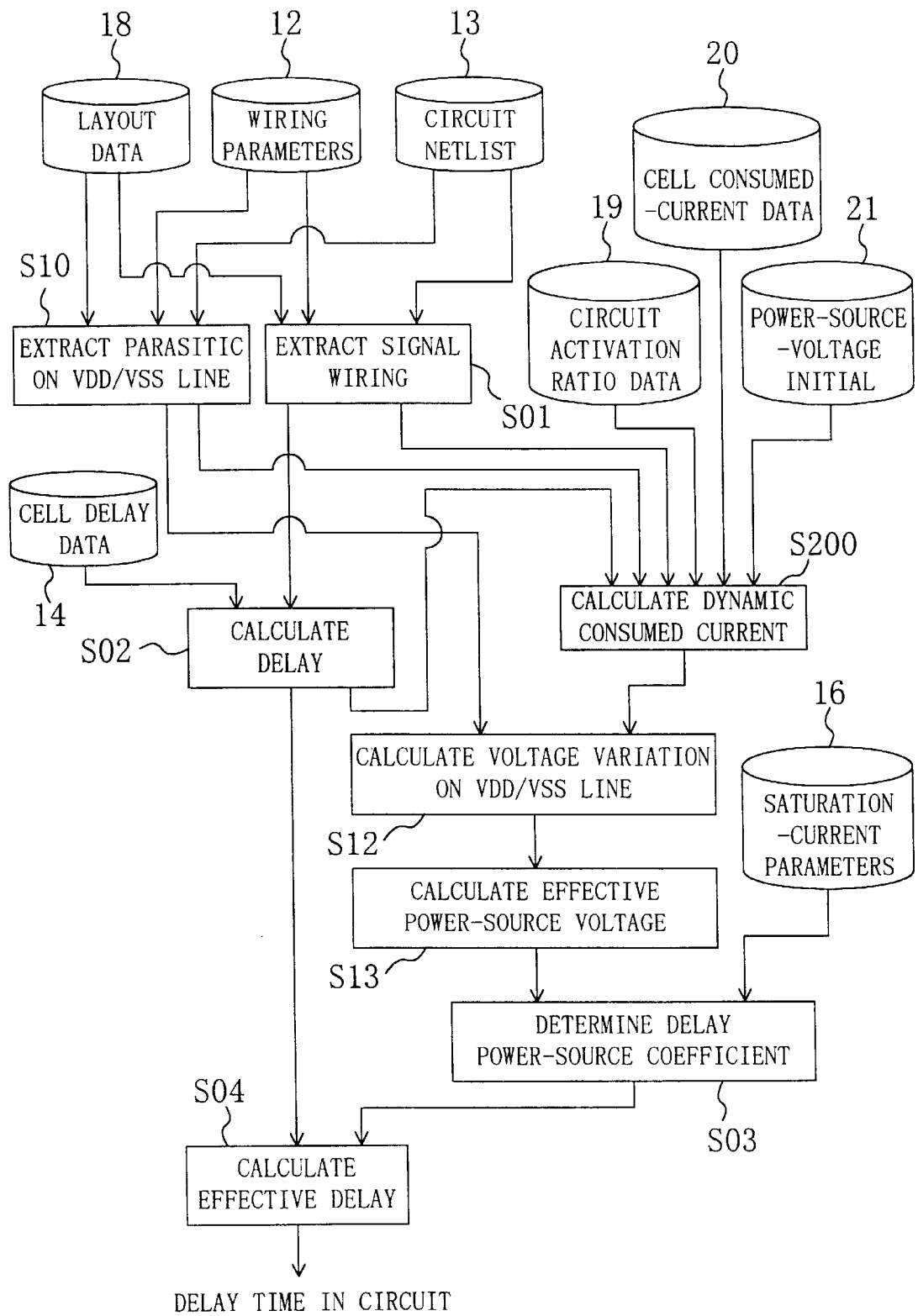
FIG. 16 illustrates a flow of operations in an apparatus for calculating a delay for a logic circuit according to a fourth embodiment of the present invention.

FIG. 16 illustrates the flow of operations in a delay calculating apparatus according to the present embodiment, in which voltage variations on the VDD and VSS lines and the operating time of a logic element in a logic circuit have been considered. As for like components shown in FIGS. 14 and 16, the description thereof will be omitted by providing like reference numerals. The delay calculating method/apparatus according to the present embodiment utilizes the layout data extraction program 112, the cell delay calculation program 113, the circuit delay calculation program 114, the consumed current calculation program 115 and the effective power-source voltage calculation program 116, which are shown in FIG. 26. The fourth embodiment is different from the third embodiment in that dynamic variations in consumed current are considered in a dynamic-consumed-current calculating step S200 based on the result of calculation performed in the delay calculating step S02 and the result of extraction performed in the power-source-line-wiring-parasitic extracting step S10.

In the present embodiment, the required steps are respectively executed by the programs shown in FIG. 26. More specifically, the procedures for the signal-wiring extracting step S01 and the power-source-line-wiring-parasitic extracting step S10 are executed by the layout data extraction program 112; the procedure for the delay-power-source-coefficient determining step S03 is executed by the cell delay calculation program 113; the procedures for the delay calculating step S02 and the effective-delay calculating step S04 are executed by the circuit delay calculation program 114; the procedure for the dynamic-consumed-current calculating step S200 is executed by the consumed current calculation program 115; and the procedures for the power-source-line-voltage-variation calculating step S12 and the effective-power-source-voltage calculating step S13 are executed by the effective power-source voltage calculation program 116.

Figure 17:
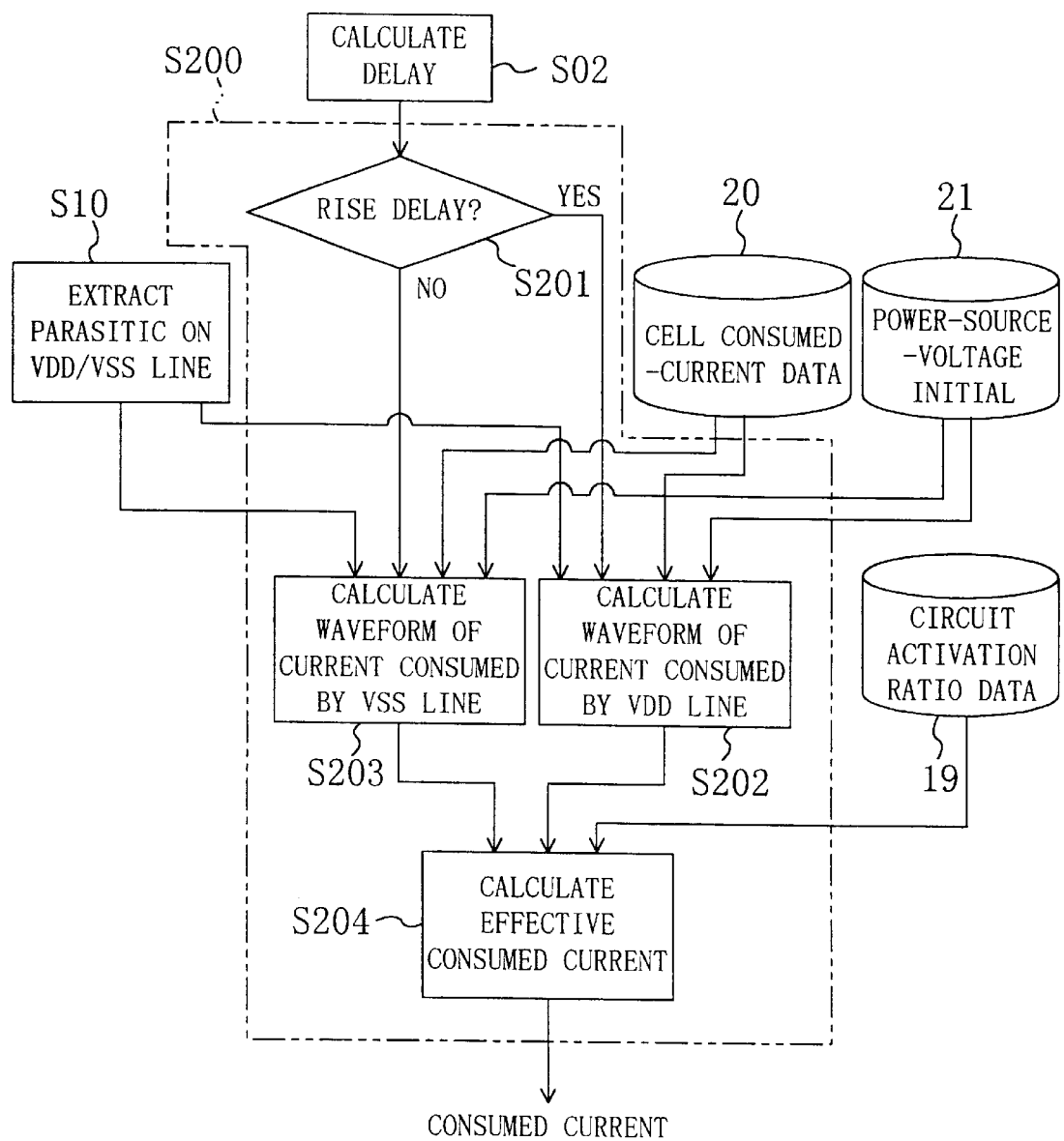
FIG. 17 illustrates in greater detail a flow of operations for calculating a dynamic power consumption in the delay calculating apparatus according to the fourth embodiment.

FIG. 17 illustrates in greater detail the flow of the dynamic-consumed-current calculating step S200 in FIG. 16. As shown in FIG. 17, a circuit-delay judging step S201 performed in response to the result of calculation from the delay calculating step S02 is for judging whether a gate output in a delay path with a maximum circuit delay and another gate output are rise delays or fall delays. It is assumed that a current flows through the VDD line in the case of rise delays and a current flows through the VSS line in the case of fall delays. Hence, in the case of rise delays, a consumed current flowing through one VDD line is calculated in accordance with the operating time of a logic element connected to the VDD line in a VDD-line-consumed-current-waveform calculating step S202. In the case of fall delays, on the other hand, a consumed current flowing through one VSS line is calculated in accordance with the operating time of a logic element connected to the VSS line in a VSS-line-consumed-current-waveform calculating step S203.

Since the result of delay calculation is normally obtained by using a static timing-analyzing technique, if the sum of respective currents consumed by all logic elements is calculated by using the static technique, the sum of the consumed current includes a current consumed by a logic element not operating at the same time. To avoid this, currents actually consumed by logic elements operating at the same time is calculated by using the circuit activation ratio data 19.

Referring next to FIGS. 18, respective procedures performed in the VDD-line-consumed-current-waveform calculating step S202 and in the VSS-line-consumed-current-wave form calculating step S203 shown in FIG. 17 will be described. FIGS. 18 show a relationship between the VSS or VDD line and each of logic gates performing a switching operation by using the full adder according to the third embodiment shown in FIG. 15. In the drawing, the first NAND gate G1, the first NAND-OR composite gate G2, the second,NAND-OR composite gate G4, and the second NAND gate G5 are connected to one pair of VDD and VSS lines, while the EX-NOR gate G3 and the third NAND gate G6 are connected to the other pair of VDD and VSS lines. It is assumed here that the maximum delay path passes through the nodes b, u, v, and s and, respective potentials, i.e., respective logic values at the nodes b, u, v, and s make transitions from {b, u, v, s}={0, 1, 0, 1} to {b, u, v, s} {1, 0, 1, 0}. At that time, respective logic values at the other nodes can be determined based on the result of static timing analysis or the like.

In the case where a test pattern that can be activated as the foregoing potential variations is observed at the respective nodes b, u, v, and s of the maximum delay path, it is assumed that a current flows through the VDD line when the logic circuit at each node in the logic circuit makes a transition from "0" to "1," while a current flows through the VSS line when the logic value makes a transition from "1" to Ito it If the assumption is to be simplified, the foregoing, logic-value transitions are set at the respective nodes of the maximum delay path. For the other nodes, it is determined through which one of the VDD and VSS lines a current is allowed to flow based on the transition probability determined based on the logic function shown in the third embodiment.

Figures 19A, 19B:
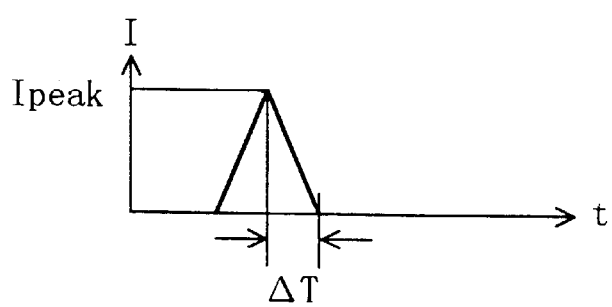
FIG. 19(a) shows an example of cell consumed-current data in the delay calculating apparatus according to the fourth embodiment.
FIG. 19(b) shows the waveform of a cell consumed current in the delay calculating apparatus according to the fourth embodiment.

FIG. 19(a) shows an example of the components of the cell consumed-current data 20 used in calculating a consumed current, which is contained in the library shown in FIG. 17. As shown in FIG. 19(b), the consumed current I obtained by triangular-approximation is contained in the library, in which a load capacitance, a wiring resistance (time constant RC), a peak current Ipeak in accordance with the load capacitance and wiring resistance, and a half-width $\Delta T$ are described.

Figure 18A:
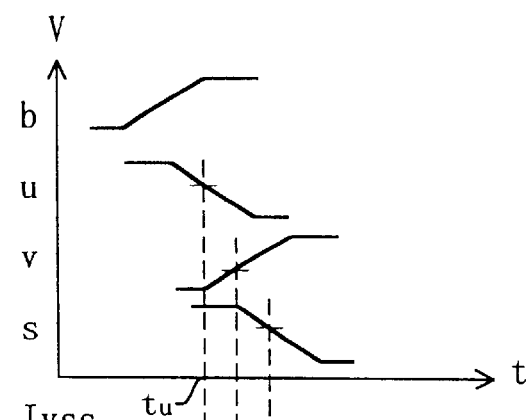
FIGS. 18(a) to 18(d) illustrate methods of calculating a current consumed by a logic circuit and compensating for a delay time for the logic circuit in the delay calculating apparatus according to the fourth embodiment.
Figure 18B:
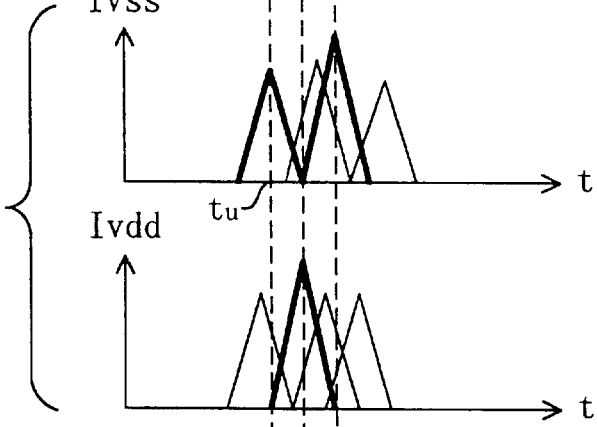

First, as seen from FIG. 18(a), voltages V at the nodes b and v increase because of the logic values making transitions from "0" to "1", while voltages V at the nodes u and s decrease because of the logic values making transitions from "1" to "0." The time of the peak current Ipeak obtained by triangular-approximation, which is shown in FIG. 18(b), is caused to coincide with the switching times of the respective logic elements and respective currents consumed by the VDD and VSS lines are calculated by superimposing the current waveforms of the respective logic elements. At that time, the waveforms of the currents consumed by the logic elements connected to one pair of VDD and VSS lines are superimposed, while the result of extraction performed in the wiring-parasitic-element extracting step S10 for the VDD and VSS lines is referenced. In the case of the full adder shown in FIG. 15, the waveforms of consumed currents flowing through the first NAND gate G1, the first NAND-OR composite gate G2, the second NAND-OR composite gate G4, and the second NAND gate G5 are superimposed on each other.

Figure 18C:
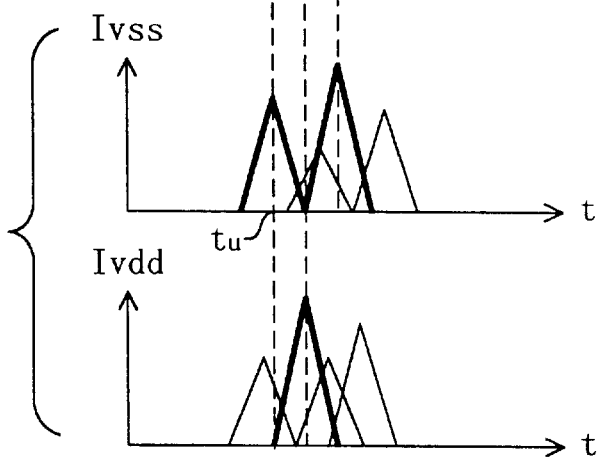

Next, as shown in FIG. 18(c), an effective consumed current flowing through the full adder is calculated. As described above, if the normal static timing-analyzing technique is used, the sum of currents consumed by all logic elements may contain a current consumed by a logic element not operating at the same time. To prevent this, in the logic elements contained in the maximum delay path (path to be analyzed), a current consumed by a logic transition when the delay becomes maximum is set. In the other logic elements, the consumed current is multiplied by the circuit activation ratio Ks in the circuit activation ratio data 19 so that an effective consumed current is calculated.

When a test pattern which provides the maximum delay path is obtained, the circuit activation ratio data 19 is determined based on changes in output from the respective logic elements. For further simplification, it is sufficient to calculate by using the transition probability determined by the logic function, as shown in the third embodiment.

Figure 18D:
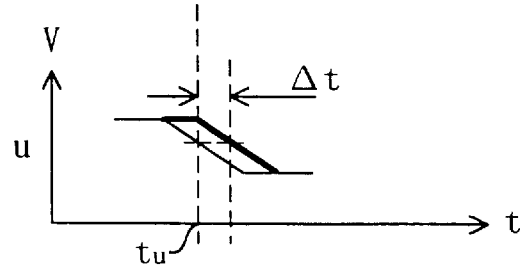

Next, as shown in FIG. 18(d), voltage drops on the pair of VDD and VSS lines are calculated from the consumed currents flowing therethrough. Thereafter, the effective power-source voltage is calculated for each of the logic elements and the effective delay time is calculated by compensating for the delay time $\Delta T$, similarly to the third embodiment. The delay time At can be calculated by using the voltage drop Vdrop in the numerical expression (11), the effective power-source voltage Vddeff in the numerical expression (12), and the consumed current Idgate in the numerical expression (13). As shown in the numerical expression (13), the time-dependency of the consumed current Idgate is depending on the switching period Ts of the logic element. Hence, by sequentially compensating for the delay time $\Delta T$ for the logic elements in order of temporal precedence of the operating times thereof and calculating again the time-dependency of the consumed current by using the delay time after compensation, the effective delay time in consideration of the time-dependency of the consumed current Idgate can be calculated. Although FIG. 18(d) shows only the delay at the node u which is the output of the first NAND gate G1, similar compensation is performed with respect to the outputs of the other logic elements.

Thus, according to the present embodiment, an increased delay time resulting from voltage variations on the VDD and VSS lines produced in an integrated circuit with a smaller feature size can be estimated reliably by considering a dynamic variation in consumed current in calculating a logic-level delay.

As for impedance variations on power-source lines having dependency on frequency which are caused by the capacitance (C) or inductance (L) component connected to the VDD and VSS lines, they can similarly be calculated from the time-dependency of the consumed current.

Although the present embodiment has calculated a delay based on design data after the completion of layout design, an increased delay can also be estimated by calculating a wiring resistance based on data estimated from a floor plan prior to the layout design.

Although a circuit in a building block system employing standard cells has been postulated, a circuit such as a gate array may also be used.

Fifth Embodiment

A fifth embodiment of the present invention will be described with reference to the drawings.

Figure 20:
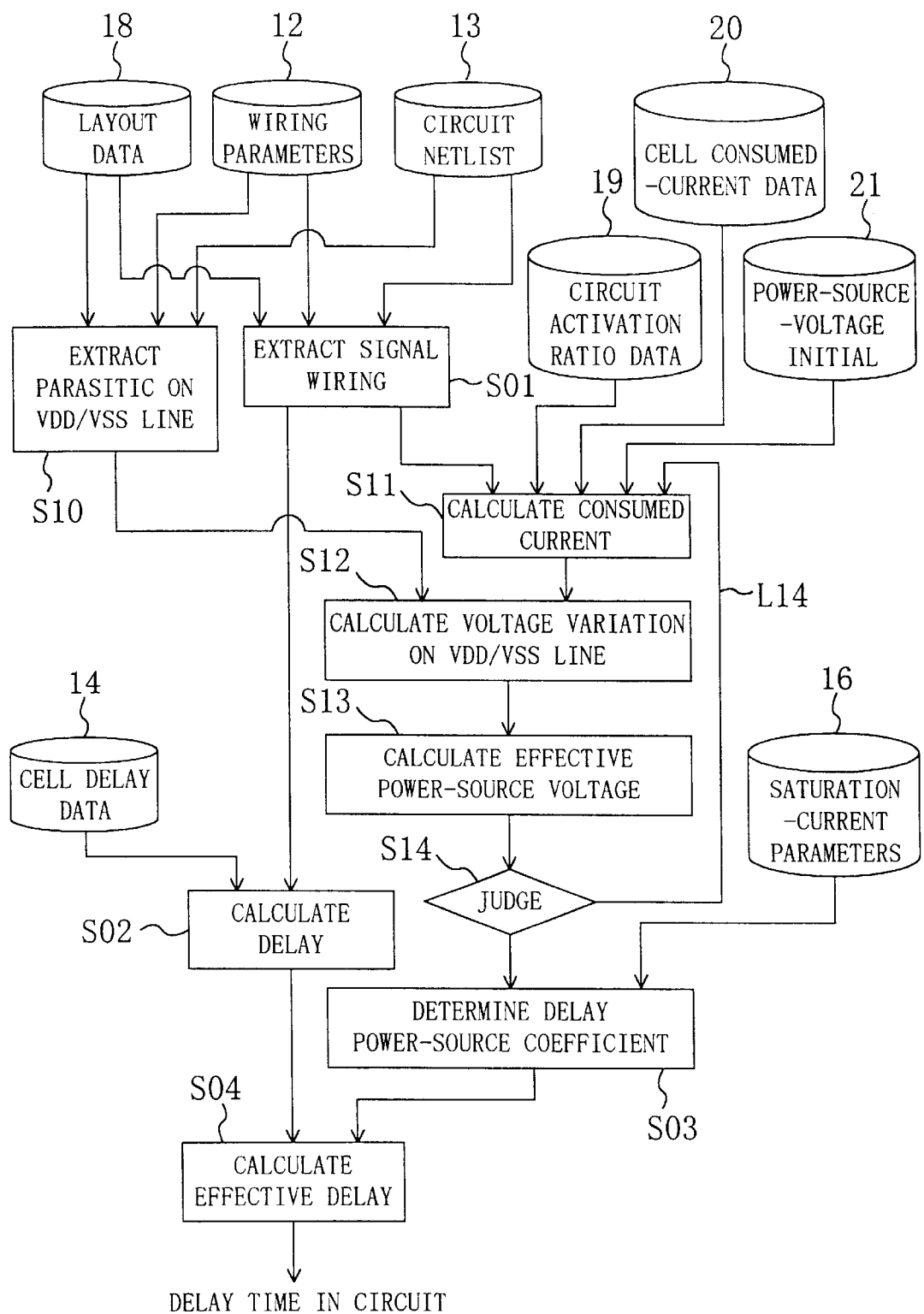
FIG. 20 illustrates a flow of operations in an apparatus for calculating a delay for a logic circuit according to a fifth embodiment of the present invention.

FIG. 20 illustrates the flow of operations of a delay calculating apparatus according to a fifth embodiment of the present invention, in which voltage variations on the VDD and VSS lines in a logic circuit have been considered.

The delay calculating method/apparatus according to the present embodiment utilizes the layout data extraction program 112, the cell delay calculation program 113, the circuit delay calculation program 114, the consumed current calculation program 115 and the effective power-source voltage calculation program 116, which are shown in FIG. 26.

The present embodiment is characterized by calculation loop step L14 for recursively calculation and convergence-condition judging step S14 which have been introduced to calculate the consumed currents and voltage variations on the power-source lines in the delay calculating apparatus shown in the third embodiment to increase the accuracy of the effective power-source voltage, since the consumed current and the effective power-source voltage are dependent on each other.

A description will be given to the operation of the delay calculating apparatus thus constituted.

Here, the description will be given only to the difference between the third and fifth embodiments.

In the consumed-current calculating step S11, the consumed-current calculating means calculates the current Idd(0) consumed by the integrated circuit to be analyzed based on the power-source-voltage initial value 21. Then, in the effective-power-source-voltage calculating step S13, the effective-power-source-voltage calculating means calculates the effective power-source voltage Vdd(0) in consideration of voltage variations on the VDD and VSS lines based on the consumed current Idd(0). The effective-power-source-voltage calculating means calculates again the consumed current Idd(1) based on the effective power-source voltage Vdd(0) and further calculates the effective power-source voltage Vdd(1). After recursive calculations of the consumed current Idd(i) (i is an integer equal to or more than 1) and the effective power-source voltage Vdd(i) (i is an integer equal to or more than 1), the convergence-condition judging means judges whether or not convergence conditions represented by the following numerical expression (14) are satisfied:

$$|Vdd(i)-Vdd(i-1)| \leq \delta \qquad (14)$$

where Vdd(i) is the effective power-source voltage determined by the i-th calculation loop L14, Vdd(i-1) is the effective power-source voltage determined by the (i-1)-th calculation loop L14, and δ is the upper limit of the range of convergence for the effective power-source voltages, which has a value corresponding to about 1% of the power-source voltage for example. If the numerical expression (14) is satisfied, the process escapes from the calculation loop L14 and the power-source voltage Vdd(i) finally calculated is defined as the effective power-source voltage Vddeff.

Thereafter, the procedures in the delay calculating step S02, in the delay-power-source-coefficient determining step S03, and in the effective-delay calculating step S04 are sequentially performed, similarly to the third embodiment, thereby calculating the effective delay time in the integrated circuit to be analyzed.

In the present embodiment, the required steps are respectively executed by the programs shown in FIG. 26. More specifically, the procedures for the signal-wiring extracting step S01 and the power-source-line-wiring-parasitic extracting step S10 are executed by the layout data extraction program 112; the procedure for the delay-power-source-coefficient determining step S03 is executed by the cell delay calculation program 113; the procedures for the delay calculating step S02 and the effective-delay calculating step S04 are executed by the circuit delay calculation program 114; the procedure for the consumed-current calculating step S11 is executed by the consumed current calculation program 115; and the procedures for the power-source-line-voltage-variation calculating step S12 and the effective-power-source-voltage calculating step S13, the calculation loop step L14 and the convergence-condition judging step S14 are executed by the effective power-source voltage calculation program 116.

Thus, according to the present embodiment, the current consumed by the circuit and the effective power-source voltage supplied thereto, which are greatly dependent on each other, are calculated by forming the recursive loop, so that the accuracy with which the delay time is calculated is further increased.

Sixth Embodiment

Below, a sixth embodiment of the present invention will be described with reference to the drawings.

Figure 21:
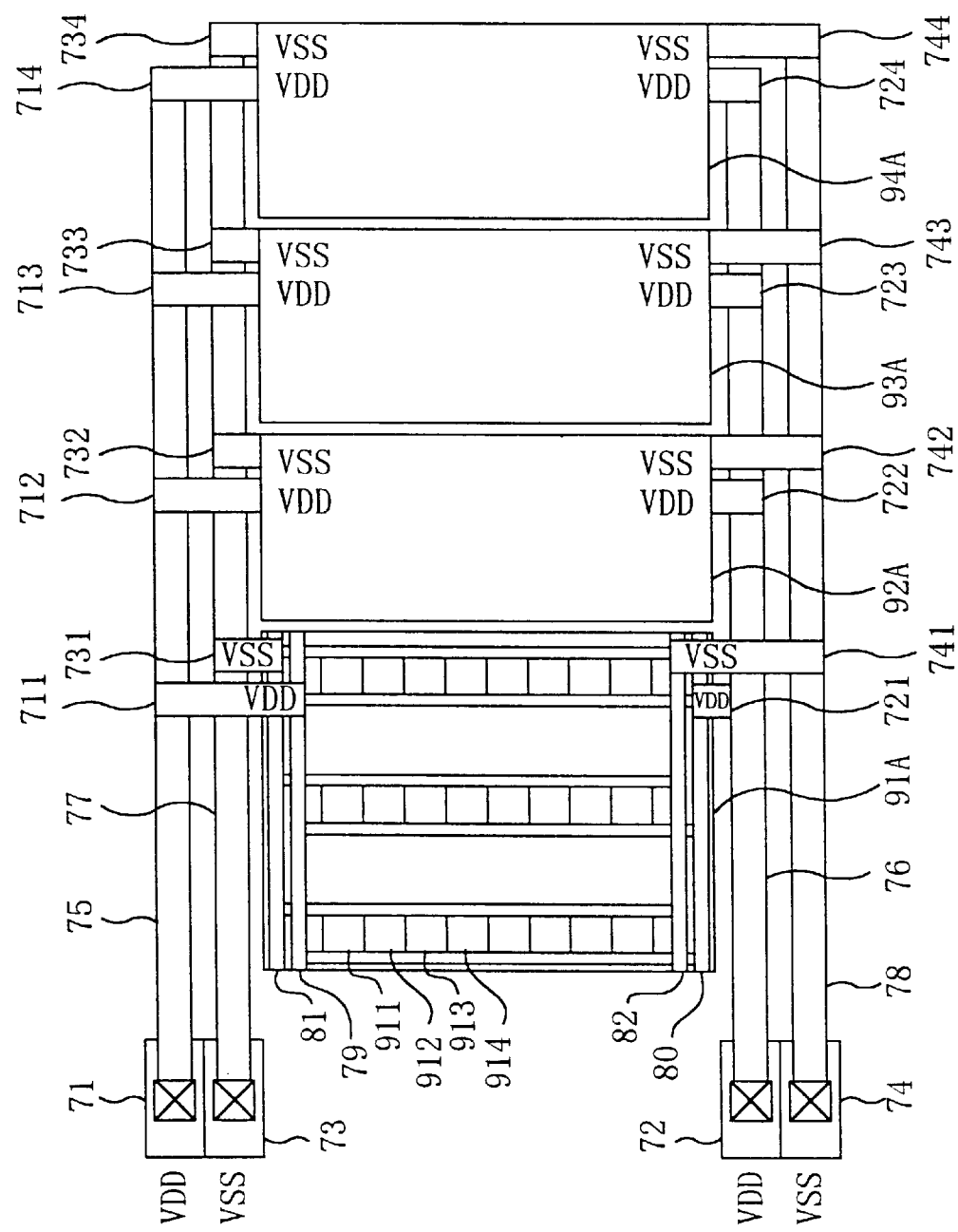
FIG. 21 shows a layout of an integrated circuit for which an apparatus for calculating a delay for a logic circuit according to a sixth embodiment of the present invention calculates a delay.

FIG. 21 shows a layout of an integrated circuit to be analyzed by a method and apparatus for calculating a delay for a logic circuit according to the sixth embodiment of the present invention.

The present embodiment is characterized in that a delay time for a standard cell is calculated by hierarchically calculating voltage variations on respective power-source lines between the external power-source terminal of the integrated circuit and the power-source terminal of a circuit block disposed inside the integrated circuit and between the circuit block and the power-source terminal of the standard cell disposed inside the block.

In FIG. 21, a first VDD terminal 71 as the external power-source terminal is connected to a first VDD line 75, a second VDD terminal 72 is connected to a second VDD line 76, a first VSS terminal 73 is connected to a first VSS line 77, and a second VSS terminal 74 is connected to a second VSS line 78. A first circuit block 91A, a second circuit block 92A, a third circuit block 93A, and a fourth circuit block 94A are connected to the first VDD line 75, the second VDD line 76, the first VSS line 77, and the second VSS line 78, respectively.

The first VDD line 75 is provided with a first VDD power-source terminal 711, a second VDD power-source terminal 712, a third VDD power-source terminal 713, and a fourth VDD power-source terminal 714. The first VSS line 77 is provided with a first VSS power-source terminal 731, a second VSS power-source terminal 732, a third VSS power-source terminal 733, and a fourth VSS power-source terminal 734.

Likewise, the second VDD line 76 is provided with a fifth VDD power-source terminal 721, a sixth VDD power-source terminal 722, a seventh VDD power-source terminal 723, and an eighth VDD power-source terminal 724. The second VSS line 78 is provided with a fifth VSS power-source terminal 741, a sixth VSS power-source terminal 742, a seventh VSS power-source terminal 743, and an eighth VSS power-source terminal 744.

In the first circuit block 91A, there are provided a first in-block VDD line 79, a second in-block VDD line 80, a first in-block VSS line 81, and a second in-block VSS line 82. There are also disposed first, second, third, and fourth standard 5 cells 911, 912, 913, and 914 connected to the first VDD line 79, the second VDD line 80, the first VSS line 81, and the second VSS line 82, respectively, each via a power-source terminal for a cell (not shown).

The second and third blocks 92A and 93A are also internally provided with a plurality of standard cells, similarly to the first circuit block 91A.

Figure 22A:
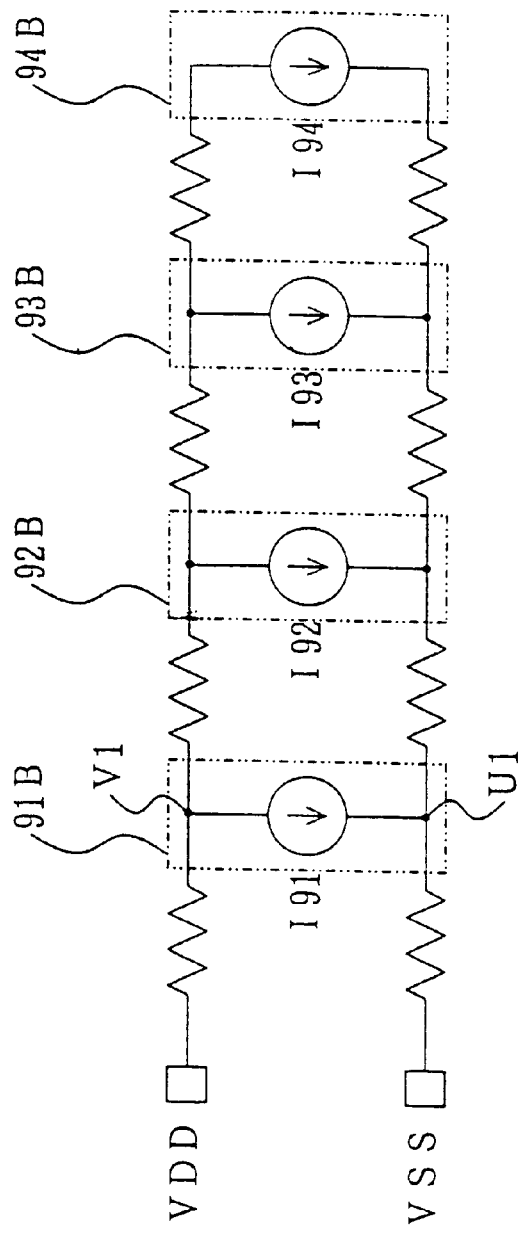
FIGS. 22(a) and 22(b) are respective circuit diagrams of equivalent circuits to the integrated circuit for which the delay calculating apparatus according to the sixth embodiment calculates a delay.

FIG. 22(a) is a circuit diagram of a first equivalent circuit to the integrated circuit shown in FIG. 21, in which are shown: a first equivalent circuit 91B to the first circuit block 91A; an equivalent circuit 92B to the second circuit block 92A; an equivalent circuit 93B to the third circuit block 93A; an equivalent circuit 94B to the fourth circuit block 94A; an average current I91 consumed by the first equivalent circuit 91B in the first circuit clock; an average current I92 consumed by the equivalent circuit block 92B in the second circuit block: an average current I93 consumed by the equivalent circuit 93B in the third circuit block; and an average current I94 consumed by the equivalent circuit block 94B in the fourth circuit block.

Figure 22B:
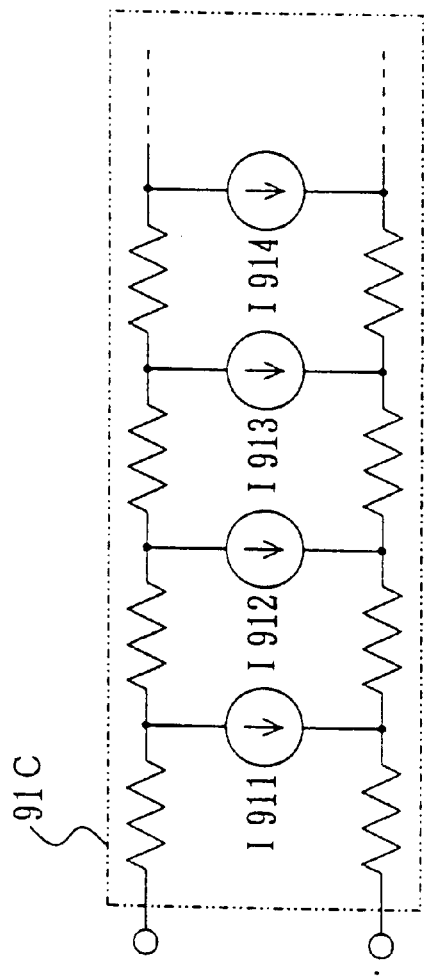

FIG. 22(b) is a circuit diagram of a second equivalent circuit to the first circuit block shown in FIG. 22(a), in which are shown: a second equivalent circuit 91C to the first circuit block; an average current.I 911 consumed by a first standard cell 911 shown in FIG. 21; an average current I912 consumed by a second standard cell 912; an average current 913 consumed by a third standard cell 913; and an average current consumed by a fourth standard cell 914.

Figure 23:
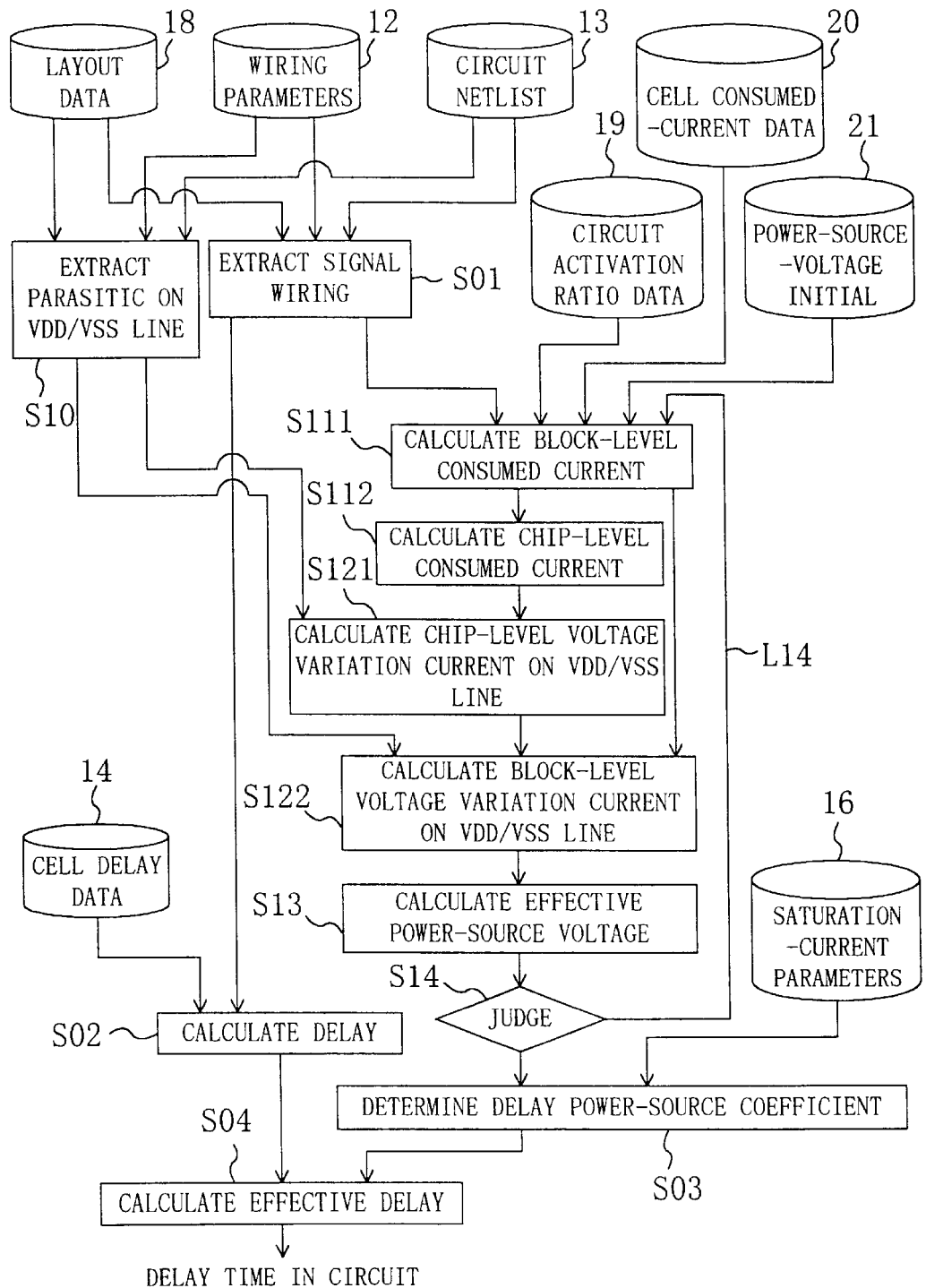
FIG. 23 illustrates a flow of operations in the delay calculating apparatus according to the sixth embodiment.

To calculate a delay in signal propagation time for the integrated circuit thus constituted in consideration of voltage variations on the VDD and VSS lines, it is necessary to sequentially and hierarchically calculate the consumed currents and the power-source voltages. FIG. 23 illustrates the flow of operations in the delay calculating apparatus, in which a hierarchical structure in a logic circuit according to the sixth embodiment has been considered. In the drawing, the description of like components shown in FIGS. 20 and 23 is omitted by providing like reference numerals.

The delay calculating method/apparatus according to the present embodiment utilizes the layout data extraction program 112, the cell delay calculation program 113, the circuit delay calculation program 114, the consumed current calculation program 115 and the effective power-source voltage calculation program 116, which are shown in FIG. 26.

As shown in FIG. 23, the present embodiment is characterized by the provision of: block-level consumed-current calculating means for calculating a current consumed by each circuit block and an effective power-source voltage supplied thereto; chip-level consumed-current calculating means for calculating the sum of the currents consumed by the respective circuit blocks calculated by the block-level consumed-current calculating means; chip-level VDD/VSS-line-voltage-variation calculating means for calculating chip-level voltage variations based on the chip-level consumed current; and block-level VDD/VSS-line-voltage-variation calculating means for calculating block-level voltage variations by using the chip-level voltage variations on the power-source lines, which are used in the steps for calculating consumed currents and effective power-source voltages.

A description will be given to the procedures of calculating consumed currents and effective power-source voltages in the delay calculating apparatus thus constituted.

As shown in FIG. 23, in a block-level-consumed-current calculating step S111, the block-level consumed-current calculating means calculates a current consumed by each standard cell (or logic gate) in a circuit block based on the power-source-voltage initial value 21 which is the reference voltage for the operation of the integrated circuit to be analyzed. For example, the block-level consumed-current calculation corresponds to the calculation of the average current 1911 consumed by the first standard cell 911 or average current 1912 consumed by the second standard cell 912 in the first circuit block 91C in the equivalent circuit shown in FIG. 22(b).

Next, in a chip-level consumed-current calculating step S112, the chip-level consumed-current calculating means calculates a current consumed by each circuit block in the integrated circuit by using the consumed current data calculated by the block-level consumed-current calculating means. For example, the chip-level consumed-current calculation corresponds to the calculation of the average current I91 consumed by the first circuit block 91B or average current I92 consumed by the second circuit block 92B in the equivalent circuit shown in FIG. 22(a).

Next, in a chip-level VDD/VSS-line-voltage-variation calculating step S121, the chip-level voltage-variation calculating means calculates chip-level voltage variations on the VDD and VSS lines between the power-source terminal of the chip and the power-source terminal of each circuit block based on the chip-level consumed-current data. For example, the calculation of chip-level voltage variations corresponds to the calculation of voltage variations on the first VDD and VSS lines 75 and 77 by using the average current 191 consumed by the first circuit block 91B and the average current 192 consumed by the second circuit block 92B.

Next, in a block-level VDD/VSS-line-voltage-variation calculating step S122, the block-level-voltage-variation calculating means calculates block-level voltage variations on the VDD and VSS lines between the power-source terminal of each circuit block and the power-source terminal of each standard cell based on the block-level consumed-current data. For example, the calculation of block-level voltage variations corresponds to the calculation of voltage variations on the first in-block VDD and VSS lines 79 and 81 based on the average current I911 consumed by the first standard cell 911 and on the average current I912 consumed by the second standard cell 912 in the first circuit block 91C.

Next, in the effective-power-source-voltage calculating step S13, the effective-power-source-voltage calculating means calculates the sum of the block-level voltage variation and the chip-level voltage variation and subtracts the sum of the voltage variations from the power-source voltage applied to the first VDD line 75, the first VSS line 77, and the like to determine an effective power-source voltage applied to each of the standard cells 911, 912, 913, and 914.

In the convergence-condition judging step S14, the consumed currents and the effective power-source voltages are recursively calculated to increase the accuracy of the effective power-source voltage, similarly to the fifth embodiment.

Thereafter, the procedures in the delay calculating step S02, in the delay-power-source-coefficient determining step S03, and in the effective-delay calculating step S04 are sequentially performed to calculate the effective delay time for the integrated circuit to be analyzed.

In the present embodiment, the required steps are respectively executed by the programs shown in FIG. 26. More specifically, the procedures for the signal-wiring extracting step S01 and the power-source-line-wiring-parasitic extracting step S10 are executed by the layout data extraction program 112; the procedure for the delay-power-source-coefficient determining step S03 is executed by the cell delay calculation program 113; the procedures for the delay calculating step S02 and the effective-delay calculating step S04 are executed by the circuit delay calculation program 114; the procedure for the block-level-consumed-current calculating step S111 and the chip-level consumed-current calculating step S112 are executed by the consumed current calculation program 115; and the procedures for the chip-level VDD/VSS-line-voltage-variation calculating step S121, the block-level VDD/VSS-line-voltage-variation calculating step S122, the effective-power-source-voltage calculating step S13, the calculation loop step L14 and the convergence-condition judging step S14 are executed by the effective power-source voltage calculation program 116.

By thus hierarchically calculating the consumed currents and the effective power-source voltages, the delay for the whole large-scale integrated circuit (i.e., 1 chip) designed by the building block system or the like can be verified reliably.

If the dynamic-consumed-current calculating step of calculating a dynamic variation in consumed current based on the result of calculation performed in the delay calculating step S02 and the result of extraction performed in the power-source-wiring-parasitic extracting step S10 is included in the block-level consumed-current calculating step S111, as described in the fourth embodiment, variations in delay time resulting from voltage variations on the power-source lines can be estimated more reliably.

Seventh Embodiment

Below, a seventh embodiment of the present invention will be described with reference to the drawings.

The present embodiment will describe a calculation method whereby the influence of a varied delay time for a logic circuit due to power-source voltages is reflected as delay data in a logic library. This calculation method allows for formation of the cell delay calculation program 113 included in the delay calculating apparatus shown in FIG. 26

Figure 24:
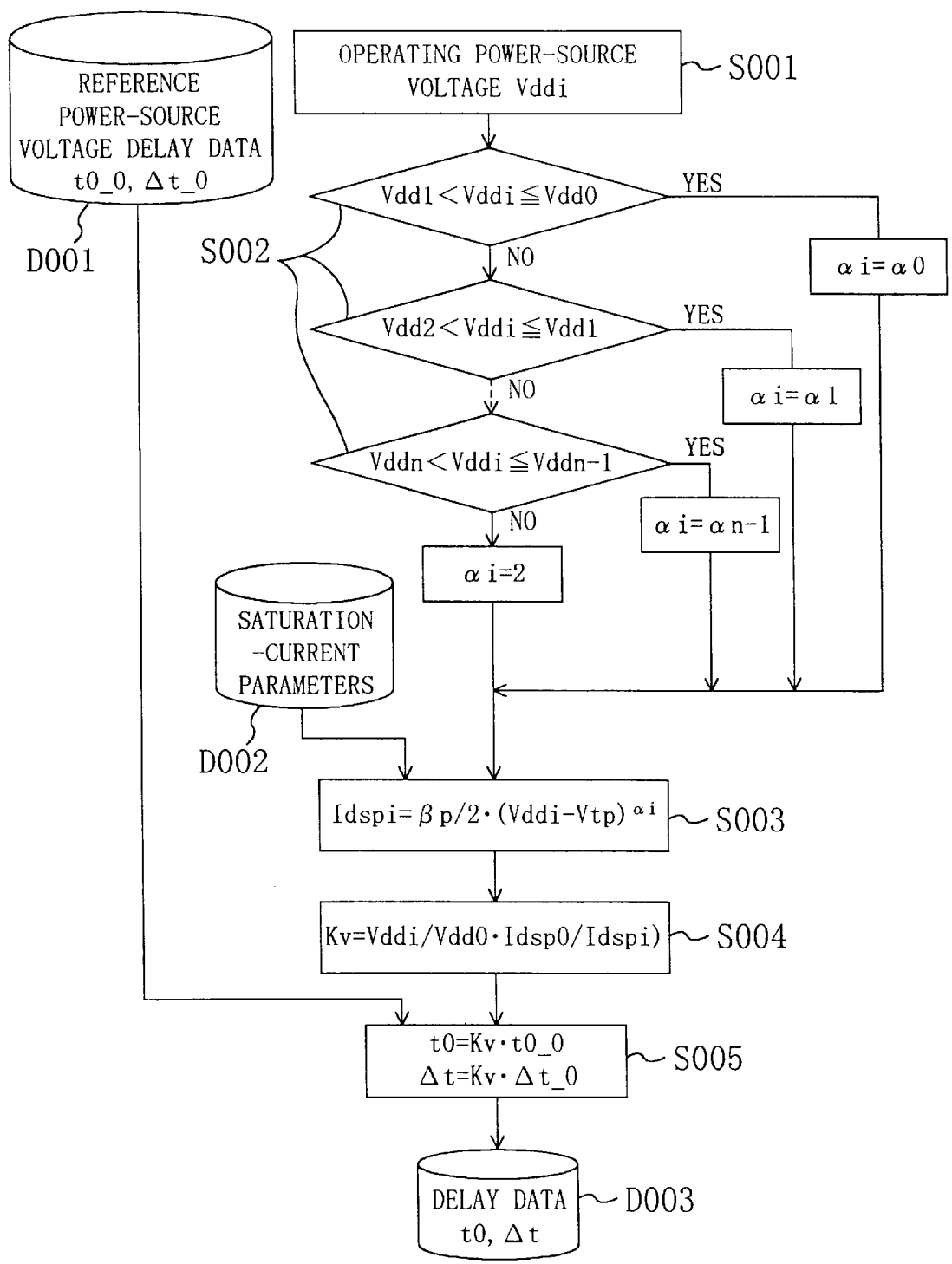
FIG. 24 is a flow chart illustrating a method of calculating delay data for a delay library according to a seventh embodiment of the present invention.

FIG. 24 illustrates the process flow in accordance with the calculation method for calculating the delay data for a delay library according to the seventh embodiment.

To simplify the calculation of the delay time, it is assumed here that the delay time consists of two components, which are a cell intrinsic delay independent of the load capacitance and a dependent delay increasing with the load capacitance. The cell delay data extracted at the reference power-source voltage Vdd0 is represented by the following numerical expression (15):

$$Td0 = t0\_0 + \Delta t\_0 \cdot C1 \qquad (15)$$

where Td0 is the signal delay time at the reference power-source voltage Vdd0, $t0\_0$ is the delay time independent of the load capacitance, and $\Delta t\_0$ is the delay time proportional to the load capacitance C1. Below, a description will be given to the procedures of calculating the dependency of the delay data $t0\_0$ and $\Delta t\_0$ shown in the numerical expression (15) on the power-source voltage. As shown in FIG. 24, the delay data $t0\_0$ and $\Delta t\_0$ at the reference power-source voltage Vdd0 is prepared as reference-power-source-voltage delay data D001 in conjunction with saturation-current parameters D002 for determining the drain saturation current Idspi, such as the mobility of carriers and the thickness of the gate oxide film. The drain saturation current Ids in the P-channel MOSFET is assumed to be the same as represented by the numerical expression (4).

First, as shown in FIG. 24, when the operating power-source voltage Vddi for the logic circuit is given to a desired cell in an operating-power-source-voltage setting step S001, the exponent $\alpha i$ is determined based on the value of the operating power-source voltage Vddi in the exponent determining step S002.

Next, in the drain-saturation-current determining step S003, Idspi is determined in accordance with the numerical expression (4). Then, in the delay-power-source-coefficient calculating step S004, the power-source voltage coefficient (Vddi/Vdd0), which is a ratio of Vddi to Vdd0 as the reference, and the current coefficient (Idsp0/Idspi), which is a ratio of the reference current Idsp0 to Idspi, are calculated so that the product of the power-source voltage coefficient and the current coefficient is calculated to provide the delay power-source coefficient Kv.

Next, in the delay-data determining step S005, the product of the reference power-source voltage delay data D001 and the delay power-source coefficient Kv is calculated to determine sets of delay data D003 (t0, $\Delta t$). The delay time Td is represented by the following numerical expression (16) by using the two sets of delay data and the result of calculation performed in accordance with the numerical expression (15):

$$Td = Kv \cdot Td0 = Kv \cdot t0_{13}\ 0 + Kv\ \Delta t\_0 \cdot C1 \qquad (16)$$

In the present embodiment, each of the reference power-source voltage delay data D001, the saturation-current parameters D002 and the delay data D003 is provided in the form of database on the main memory 110 or the storage disk 131 shown in FIG. 26.

As a specific method of defining a relationship between the operating power-source voltage Vddi and the exponent $\alpha i$, there can be considered one using a tabular model.

Thus, according to the present embodiment, the dependency of the delay data on the power-source voltage in the standard cell can be calculated easily and reliably by only supplying the operating power-source voltage Vddi to the cell composing the logic circuit and defining the relationship between the operating power-source voltage Vddi and the exponent $\alpha i$.

The present embodiment is characterized by a reduced period required to develop a cell library owing to a reduced time required to extract delay data, since a delay value obtained at specified voltage can be used in a multi-input gate such as multi-bit adder cell.

Eighth Embodiment

Below, an eighth embodiment of the present invention will be described with reference to the drawings.

The present embodiment provides a calculation method whereby the influence of a varied delay time for a logic circuit due to power-source voltages is reflected in a logic library. In accordance with the method, the dependency of each of a rise delay time and a fall delay time on the power-source voltage is calculated. This calculation allows for formation of the cell delay calculation program 113 included in the delay calculating apparatus shown in FIG. 26.

When the logic circuit has a large output load impedance, the ratio of a delay for driving an output node to a delay for driving an internal node of a cell is increased. Delays for the cells composing the logic circuit are subdivided into a rise delay whereby- the output node is driven by a P-channel MOSFET to raise an output potential from the ground potential Vss to the power-source voltage Vdd and a fall delay whereby the output node is driven by an N-channel MOSFET to lower an output potential from the power-source voltage Vdd to the ground voltage Vss.

In the present embodiment, since the dependency of the drain current on the power-source voltage in the P-channel MOSFET is different from the dependency of the drain current on the power-source voltage in the N-channel MOSFET, different delay power-source coefficients for a rise delay and different delay power-source coefficients for a fall delay are imparted to; the P-channel and N-channel MOSFETs.

Figure 25:
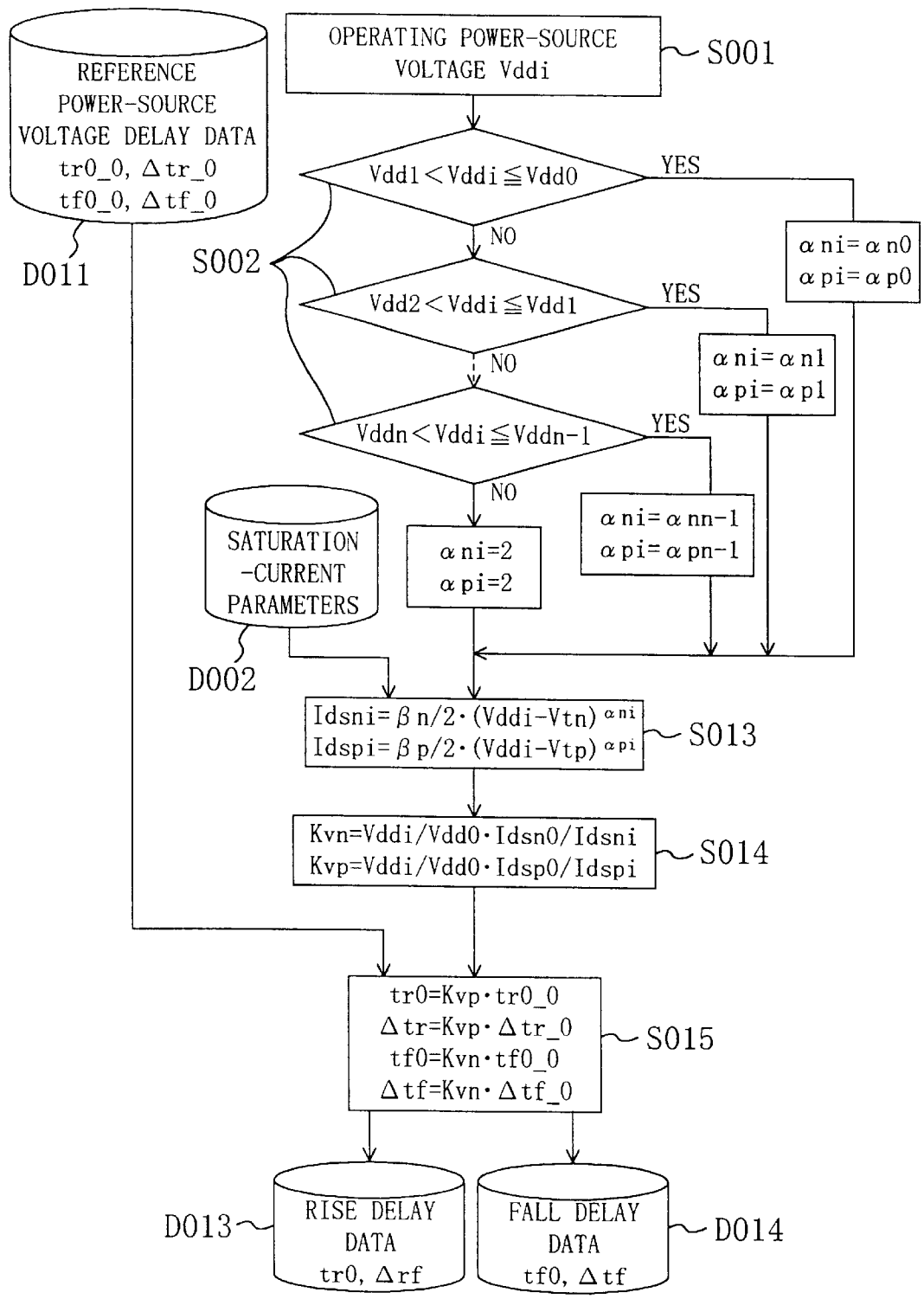
FIG. 25 is a flow chart illustrating a method of calculating delay data for a delay library according to an eighth embodiment of the present invention.

FIG. 25 shows a flow of process steps in accordance with the method of calculating delay data for a delay library according to the eighth embodiment.

To simplify the calculation of the delay time, it is assumed here that the delay time consists of four components, which are cell-intrinsic rise and fall delays independent of the load capacitance and dependent rise and fall delays increasing with the load capacitance by using the same mode as used in the numerical expression (15). Cell rise delay data and cell fall delay data each extracted at the reference power-source voltage-Vdd0 are represented by the following numerical expressions (17). and (18):

$$Tdr0 = tr0\_0 + \Delta tr\_0 \cdot C1 \tag{17}$$

$$Tdf0 = tf0\_0 + \Delta tf\_0 \cdot C1 \tag{18}$$

where Tdr0 is the signal-rise delay time at the reference power-source voltage Vdd0, Tr0_0 is the rise delay time independent of the load capacitance C1, Atr_0 is the rise delay time proportional to the load capacitance C1, Tdf0 is the signal-fall delay time at the reference power-source voltage Vdd0, Δtf0_0 is the fall delay time independent of the load capacitance C1, and Δtf_0 is the fall delay time proportional to the load capacitance C1.

A description will be given to the procedures of calculating the dependency of the rise delay data tr0_0 and, Δtr_0 shown in the numerical expression (17) on the power-source voltage and to the dependency of the fall delay data tf0_0 and Δtf_0 shown in the numerical expression (18) on the power-source voltage. For. the sake of simplicity, the description will be given only to components not shown in FIG. 24. As for like components shown in FIGS. 24 and 25, the description thereof will be omitted by providing like reference numerals. The rise delay data tr0_0 and ΔAtr_0 and the fall delay data tf0_0 and Δtf_0 at the reference power-source voltage Vdd0 -are prepared as reference power-source voltage delay data D011. The drain saturation currents Ids in the P-channel and N-channel MOSFET are assumed to be represented by the numerical expression (4).

First, as shown in FIG. 25, the operating power-source voltage Vddi for the logic circuit is supplied to a desired cell in the operating-power-source-voltage setting step S001. Then, in an exponent determining step S012, an exponent αni for the N-channel MOSFET and an exponent αpi for the P-channel MOSFET are determined individually based on the value of the operating power-source voltage Vddi.

Next, in a drain-saturation-current determining step S013, a drain saturation current Idsni in the N-channel MOSFET and a drain saturation-current Idspi in the P-channel MOSFET; are determined in accordance with the numerical expression (4).

Next, in a delay-power-source -coefficient calculating step 5014, the power-source voltage coefficient (Vddi/Vdd0) which is a ratio of the value of Vddi to the value of Vdd0 as the reference and a first current coefficient (Idsp0/Idspi) which is a ratio of the reference current Idsp0 to the drain saturation current Idspi in the P-channel MOSFET are calculated so that the product of the power-source voltage coefficient and the first current coefficient is calculated to provide a rise-delay power-source coefficient Kvp. Likewise, a second current coefficient (Idsno/Idsni) which is a ratio of the reference current Idsn0 to the drain saturation current Idsni in the N-channel MOSFET is calculated so that the product of the power-source voltage coefficient and the second current coefficient is calculated to provide a fall-delay power-source coefficient Kvn. Next, in a delay-data determining step S015, the respective products of the tr0_0 and Δtr_0 in the reference power-source voltage delay data D011 and the rise-delay power-source coefficient Kvp are calculated to determine rise delay data D013 (i.e., tr0 and Atr.). Likewise, the respective products of the tf0_0 and Δtf_0 in the reference power-source voltage delay data D011 and the fall-delay power-source coefficient Kvn are calculated to determine fall delay data D014 (i.e., tf0 and Δtf). As shown in the following numerical expression (19), the rise delay time Tdr is expressed by using the two sets of rise delay data and the result of calculation performed in accordance with the numerical expression (17). As shown in the following numerical expression (20), the fall delay time Tdf is expressed by using the two sets of fall delay data and the result of calculation performed in accordance with the numerical expression (18)

$$Tdr = Kvp\ Tdr0 = Kvp\ tr0\_0 + Kvp\ Ltr\_0 \cdot C1 \tag{19}$$

$$Tdf = Kvn\ Tdf0 = Kvn\ tf0\_0 + Kvn\ \Delta tf\_0 \cdot C1 \tag{20}$$

As a specific method of defining respective relationships between the operating power-source voltage Vddi and the exponents αpi and αni, there can be considered one using a tabular model.

In the present embodiment, each of the reference power-source voltage delay data D011, the saturation-current parameters D002 and the rise delay data D013 and the fall delay data D014 is provided in the form of database on the main memory 110 or the storage disk 131 shown in FIG. 26.

Thus, according to the present embodiment, the dependency of the delay data for a standard cell on the power-source voltage can be calculated easily and reliably by simply supplying the operating power-source voltage Vddi to the cell composing the logic circuit and defining the respective relationships between the operating power-source voltage Vddi and the exponents αpi and αni.

Moreover, since the rise delay data and the fall delay data are individually calculated to compose the delay data for the standard cell, the dependency of the delay data on the power-source voltage can be expressed more precisely so that the accuracy of the delay data is further increased.

The present embodiment is characterized by a reduced period required to develop a cell library owing to a reduced time required to extract delay data, since a delay value obtained at specified voltage can be used in a multi-input gate such as multi-bit adder cell.

I claim:

1. A storage element storing a computer readable program for calculating a delay in signal propagation time for a logic circuit composed of a plurality of logic elements each including a FET, the delay in signal propagation time for said logic circuit resulting from first and second power-source voltages being applied to said logic circuit, said program directing a computer to execute the steps of:

designating, as a power-source voltage coefficient, a ratio of said second power-source voltage to said first power-source voltage;

designating, as a current coefficient, a ratio of a drain saturation current in said FET when said first power-source voltage is applied thereto to a drain saturation current in said FET when said second power-source voltage is applied thereto;

calculating a first delay time, the first delay time being a delay time for said logic circuit when said first power-source voltage is applied thereto;

calculating a product of said first delay time, said power-source voltage coefficient, and said current coefficient; and designating the result of said product as a second delay time which is a delay time for said logic circuit when said second power-source voltage is applied thereto.

2. The storage element according to claim 1, wherein said FET is a P-channel MOSFET.

3. The storage element according to claim 1, wherein the drain saturation current in said FET is calculated by raising a difference between the power-source voltage and a threshold voltage of said FET to the power of a specified coefficient and multiplying the resulting value by a current gain coefficient.

4. A storage element storing a computer readable program for calculating a delay in signal propagation time for a logic circuit composed of a plurality of circuit blocks resulting from different effective power-source voltages at which said circuit blocks operate, each of said circuit blocks being composed of a plurality of logic elements each including a FET, said program directing a computer to execute the steps of:

calculating a power-source voltage coefficient which is a ratio of the power-source voltage for each of said circuit blocks to a reference power-source voltage;

calculating a current coefficient which is a ratio of a drain saturation current in said FET when the reference power-source voltage is applied thereto to a drain saturation current in said FET when the effective power-source voltage for each of said circuit blocks is applied thereto; and calculating a reference delay time, the reference delay time being a delay time for each of said circuit blocks when said reference power-source voltage is applied thereto;

calculating a product of said reference delay time, said power-source voltage coefficient for each of said circuit blocks, and said current coefficient for each of said circuit blocks; and designating the result of said product as an effective delay time which is a delay time for each of said circuit blocks.

5. The storage element according to claim 4, wherein said FET is a P-channel MOSFET.

6. The storage element according to claim 4, wherein the drain saturation current in said FET is calculated by raising a difference between the power-source voltage and a threshold voltage of said FET to the power of a specified coefficient and multiplying the resulting value by a current gain coefficient.

7. A storage element storing a computer readable program for calculating a delay in signal propagation time for a logic circuit composed of a plurality of logic elements each including a FET, the delay in signal propagation time for said logic circuit resulting from a variation in power-source voltage, said program directing a computer to execute the steps of:

calculating a voltage variation caused by a current consumed by said logic circuit and by a wiring parasitic on a power-source line and calculating a difference between a reference power-source voltage applied to a power-source terminal and said voltage variation to calculate an effective power-source voltage applied to said logic circuit;

calculating a power-source voltage coefficient which is a ratio of said effective power-source voltage to said reference power-source voltage, while calculating a current coefficient which is a ratio of a drain saturation current in said FET when said reference power-source voltage is applied thereto to a drain saturation current in said FET when said effective power-source voltage is applied thereto; and calculating a reference delay time, said reference delay time being a delay time for said logic circuit when said reference power-source voltage is applied thereto using said reference delay time data;

calculating a product of said reference delay time, said power-source voltage coefficient for said logic circuit, and said current coefficient for said logic circuit; and determining the result of said product as an effective delay time which is a delay time for said logic circuit when said effective power-source voltage is applied thereto.

8. The storage element according to claim 7, wherein the current consumed by said logic circuit is a sum of currents consumed by specified ones of said plurality of logic elements operating simultaneously at a given operating time and a voltage variation on a power-source line connected to said specified logic elements is calculated based on the sum of said consumed currents.

9. The storage element according to claim 7, wherein said FET is a P-channel MOSFET.

10. The storage element according to claim 7, wherein the drain saturation current in said FET is calculated by raising a difference between the power-source voltage and a threshold voltage of said FET to the power of a specified coefficient and multiplying the resulting value by a current gain coefficient.

* * * * *